(12) United States Patent
Hyun et al.

(10) Patent No.: US 12,425,051 B2
(45) Date of Patent: Sep. 23, 2025

(54) ERROR CORRECTION CODE DECODER USING CONSTACYCLIC CODE, AND MEMORY DEVICE AND MEMORY SYSTEM INCLUDING THE SAME

(71) Applicant: Samsung Electronics Co., Ltd., Suwon-si (KR)

(72) Inventors: Jihwan Hyun, Suwon-si (KR); Chanki Kim, Jeonju-si (KR); Jaewha Kim, Daejeon (KR); Jongseon No, Seoul (KR); Junghwan Choi, Suwon-si (KR)

(73) Assignees: SAMSUNG ELECTRONICS CO., LTD., Suwon-si (KR); Seoul National University R&DB Foundation (KR)

( * ) Notice: Subject to any disclaimer, the term of this patent is extended or adjusted under 35 U.S.C. 154(b) by 144 days.

(21) Appl. No.: 18/132,415

(22) Filed: Apr. 9, 2023

(65) Prior Publication Data
US 2024/0097709 A1    Mar. 21, 2024

(30) Foreign Application Priority Data
Sep. 8, 2022 (KR) .......... 10-2022-0113963

(51) Int. Cl.
*H03M 13/15* (2006.01)
*G06F 11/10* (2006.01)
*H03M 13/00* (2006.01)

(52) U.S. Cl.
CPC ....... *H03M 13/159* (2013.01); *G06F 11/1044* (2013.01); *H03M 13/611* (2013.01)

(58) Field of Classification Search
CPC ............ G06F 11/1076; G06F 11/1008; G06F 11/1044; H03M 13/13; H03M 13/17; H03M 13/15; H03M 13/611; H03M 13/1111; H03M 13/159
See application file for complete search history.

(56) References Cited

U.S. PATENT DOCUMENTS

| | | | |
|---|---|---|---|
| 4,488,302 A | 12/1984 | Ahamed | |
| 5,381,423 A | 1/1995 | Turco | |
| 7,103,818 B2 | 9/2006 | Yedidia et al. | |
| 7,155,656 B1 | 12/2006 | Chavali | |
| 7,231,579 B1 | 6/2007 | Pines et al. | |

(Continued)

FOREIGN PATENT DOCUMENTS

KR     100698620 B1    3/2007

*Primary Examiner* — Mark D Featherstone
*Assistant Examiner* — Jeffrey Andrew Yang
(74) *Attorney, Agent, or Firm* — Muir Patent Law, PLLC

(57) ABSTRACT

An error correction code (ECC) decoder includes a syndrome generator and a burst error corrector. The syndrome generator generates global syndrome data and local syndrome data using input data and a parity check matrix based on a constacyclic code. The burst error corrector corrects a correctable error included in the input data using the global syndrome data and the local syndrome data. The input data includes a plurality of data bits arranged along a first direction and a second direction. The ECC decoder simultaneously corrects a single burst error and a multi-bit error. The single burst error occurs on two or more symbols arranged along the first direction in the input data, and each symbol includes two or more data bits. The multi-bit error randomly occurs on two or more data bits in the input data.

20 Claims, 20 Drawing Sheets

(56) References Cited

U.S. PATENT DOCUMENTS

| | | |
|---|---|---|
| 7,337,386 B2 | 2/2008 | Chang et al. |
| RE44,053 E | 3/2013 | Chang et al. |
| RE44,076 E | 3/2013 | Chang et al. |
| 9,203,437 B2 | 12/2015 | Kern et al. |
| 2019/0334549 A1* | 10/2019 | Kim ................. H03M 13/1575 |
| 2021/0049068 A1* | 2/2021 | Schaefer ............. G06F 11/1076 |
| 2021/0224155 A1* | 7/2021 | Bains ................. G06F 11/1048 |

* cited by examiner

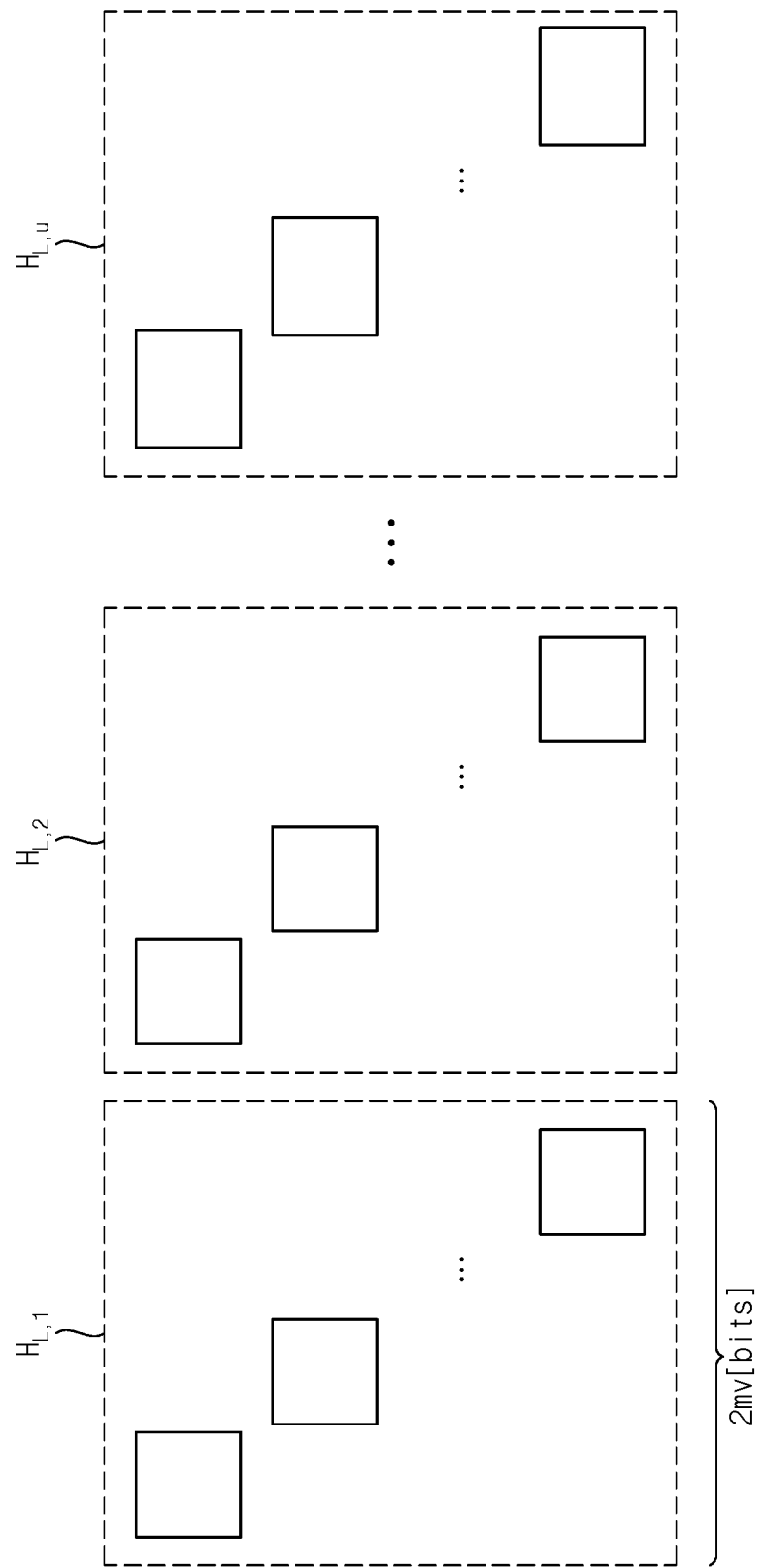

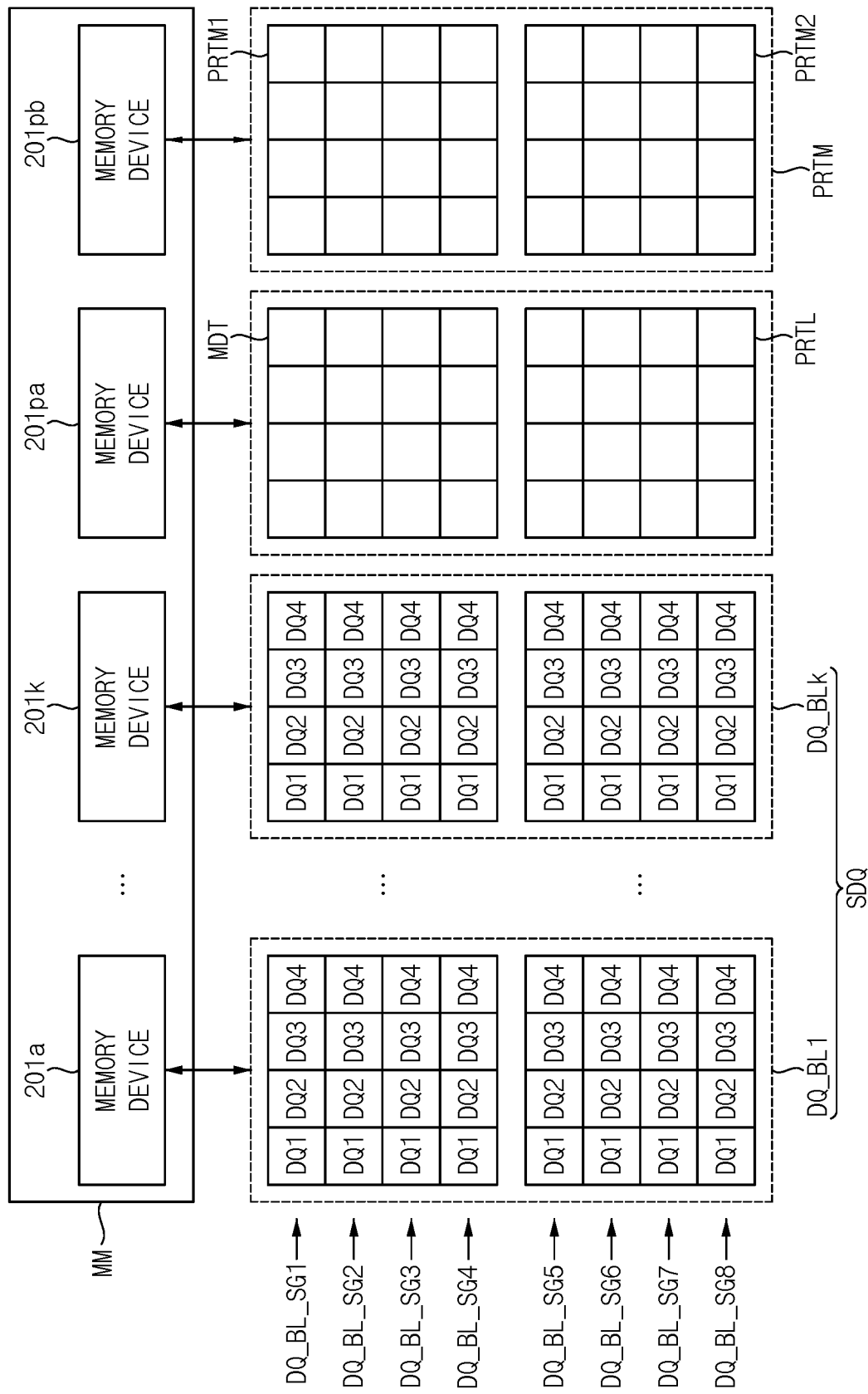

ERROR CORRECTION CODE DECODER USING CONSTACYCLIC CODE, AND MEMORY DEVICE AND MEMORY SYSTEM INCLUDING THE SAME

CROSS-REFERENCE TO RELATED APPLICATION(S)

This application claims priority under 35 USC § 119 to Korean Patent Application No. 10-2022-0113963 filed on Sep. 8, 2022 in the Korean Intellectual Property Office (KIPO), the contents of which are herein incorporated by reference in their entirety.

BACKGROUND

1. Technical Field

Example embodiments relate generally to semiconductor integrated circuits, and more particularly to error correction code (ECC) decoders using constacyclic code, and memory devices and memory systems including the ECC decoders.

2. Description of the Related Art

Semiconductor memory devices may be classified into nonvolatile memory devices, such as flash memories, and volatile memory devices, such as dynamic random access memories (DRAMs). High speed operation and cost efficiency of volatile memory devices make it possible for volatile memory devices to be used for system memories. Miniaturization and/or increased integration of memory devices is a desirable goal in semiconductor memory device manufacturing. Due to the continuing reduction in size of fabrication design rules of the volatile memory devices, bit errors in memory cells of the volatile memory devices may increase rapidly and yield of the volatile memory devices may decrease. In addition, a plurality of volatile memory devices may be provided in the form of memory modules in order to provide a relatively large storage capacity. Thus, various research projects to reduce bit errors and improve reliability of the volatile memory devices and the memory modules are ongoing.

SUMMARY

At least one example embodiment of the present disclosure provides an error correction code (ECC) decoder capable of efficiently performing an ECC decoding with high reliability by simultaneously considering a multi-bit error and a burst error.

At least one example embodiment of the present disclosure provides a memory device and a memory system that include the ECC decoder.

According to example embodiments, an error correction code (ECC) decoder includes a syndrome generator and a burst error corrector. The syndrome generator generates global syndrome data and local syndrome data using input data and a parity check matrix based on a constacyclic code. The burst error corrector corrects a correctable error included in the input data using the global syndrome data and the local syndrome data. The input data includes a plurality of data bits arranged along a first direction and a second direction. The plurality of data bits may include a plurality of symbols each symbol including two or more consecutive data bits along the first direction. Errors of the input data may include a single burst error and a multi-bit error. The single burst error may occur on two or more symbols arranged along the first direction, and the multi-bit error may randomly occur on two or more data bits of the plurality of data bits. The ECC decoder simultaneously corrects the single burst error and the multi-bit error.

According to example embodiments, a memory system includes a memory module and a memory controller. The memory module includes a plurality of memory devices. The memory controller includes a system error correction code (ECC) engine, and controls the memory module. The system ECC engine includes a system ECC decoder that performs an ECC decoding. The system ECC decoder includes a first syndrome generator and a first burst error corrector. The first syndrome generator generates first global syndrome data and first local syndrome data using codeword set provided from the memory module and a first parity check matrix based on a constacyclic code. The first burst error corrector corrects a correctable error included in the codeword set using the first global syndrome data and the first local syndrome data. The codeword set includes a plurality of data bits arranged along a first direction and a second direction. The plurality of data bits may include a plurality of symbols each symbol including two or more consecutive data bits along the first direction. Errors of the codeword set may include a single burst error and a multi-bit error. The single burst error may occur on two or more symbols arranged along the first direction, and the multi-bit error may randomly occur on two or more data bits of the plurality of data bits. The system ECC decoder corrects the single burst error or detects the multi-bit error.

According to example embodiments, a memory device includes a memory cell array and an error correction code (ECC) decoder. The ECC decoder performs an ECC decoding on read data provided from the memory cell array, and includes a syndrome generator and a burst error corrector. The syndrome generator generates global syndrome data and local syndrome data using the read data and a parity check matrix based on a constacyclic code. The burst error corrector corrects a correctable error included in the read data using the global syndrome data and the local syndrome data. The read data includes a plurality of data bits arranged along a first direction and a second direction. The plurality of data bits may include a plurality of symbols each symbol including two or more consecutive data bits along the first direction. Errors of the read data may include a single burst error and a multi-bit error. The single burst error may occur on two or more symbols arranged along the first direction, and the multi-bit error may randomly occur on two or more data bits of the plurality of data bits. The ECC decoder simultaneously detects the single burst error and the multi-bit error.

In the ECC decoder, the memory device, and the memory system according to example embodiments, the ECC decoding may be performed using the parity check matrix based on the constacyclic code, and the single burst error and the multi-bit error may be may simultaneously detected and/or corrected. Therefore, the ECC decoder may have relatively robust structure even in terms of multi-bit errors, which have not been considered in the past. Accordingly, the ECC decoding may be efficiently performed while reducing the performance loss and increasing the reliability.

BRIEF DESCRIPTION OF THE DRAWINGS

Illustrative, non-limiting example embodiments will be more clearly understood from the following detailed description taken in conjunction with the accompanying drawings.

FIGS. 5, 6A, 6B and 6C are diagrams for describing a parity check matrix based on a constacyclic code used in an ECC decoder of FIG. 3 according to example embodiments.

FIGS. 9A and 9B are diagrams illustrating examples of data sets corresponding to a plurality of burst lengths in a memory system of FIG. 7 according to example embodiments.

DETAILED DESCRIPTION OF THE EMBODIMENTS

Figure 1:
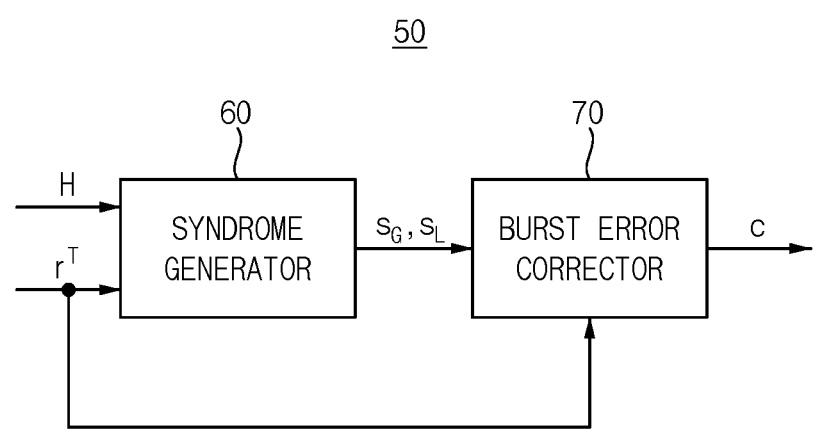
FIG. 1 is a block diagram illustrating an error correction code (ECC) decoder according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating an error correction code (ECC) decoder according to example embodiments.

Referring to FIG. 1, an error correction code (ECC) decoder 50 includes a syndrome generator (SG) 60 and a burst error corrector (BEC) 70. The ECC decoder 50 may be referred to as a burst decoder (BD) or a low-latency burst decoder.

The syndrome generator 60 generates global syndrome data $s_G$ and local syndrome data $s_L$ using input data $r^T$ and a parity check matrix H based on a constacyclic code.

In some example embodiments, the ECC decoder 50 may be included in a memory device (or memory chip) and a memory system including the memory device. For example, the memory system may include the memory device and a memory controller controlling the memory device, and the ECC decoder 50 may be included in at least one of the memory controller and the memory device. For example, the input data $r^T$ may be a codeword or data that is output (or read or retrieved) from the memory device and is a target of an ECC decoding. The input data $r^T$ will be described with reference to FIG. 2.

In some example embodiments, the parity check matrix H may be obtained by transforming a Fire code designed based on a conventional cyclic code into the constacyclic code. The constacyclic code and the parity check matrix H will be described with reference to FIGS. 5, 6A, 6B and 6C.

The burst error corrector 70 corrects a correctable error included in the input data $r^T$ using the global syndrome data $S_G$ and the local syndrome data $s_L$, and generates and outputs output data c corresponding to the input data $r^T$. For example, when an error correction is performed on the input data $r^T$ because when the correctable error is included in the input data $r^T$, the output data c may be error corrected data. When the error correction is not performed on the input data $r^T$ because the correctable error is not included in the input data $r^T$ or an uncorrectable error is included in the input data $r^T$, the output data c may be non-corrected data that is substantially the same as the input data $r^T$.

Example configurations of the syndrome generator 60 and the burst error corrector 70 will be described with reference to FIGS. 3 and 4.

Figure 2:
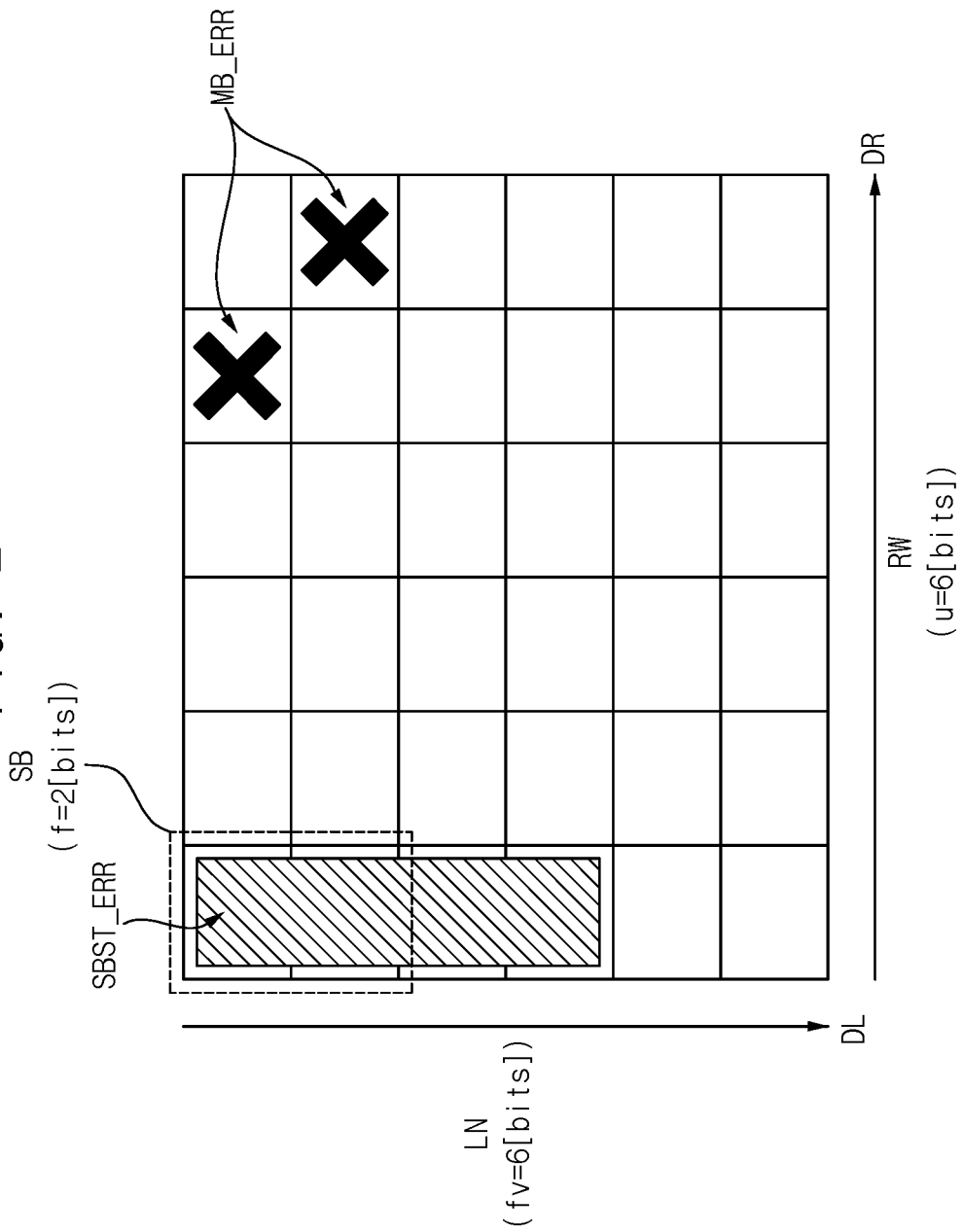
FIG. 2 is a diagram for describing input data provided to an ECC decoder of FIG. 1 according to example embodiments.

FIG. 2 is a diagram for describing input data provided to an ECC decoder of FIG. 1 according to example embodiments.

Referring to FIGS. 1 and 2, a data pattern of the input data $r^T$ is illustrated, and an error pattern (or error model) that may occur on the input data $r^T$ is illustrated.

The input data $r^T$ may include a plurality of data bits that are arranged along a first direction DL and a second direction DR. In FIG. 2, a single square illustrated by solid lines represents one data bit (or simply one bit).

For example, for positive integers f, v and u, the input data $r^T$ may be represented as an fv*u two-dimensional (2D) bit-wise array.

In FIG. 2, u may represent the number of data bits included in one row RW of the input data $r^T$, and u may correspond to the number of data input/output (I/O) pins of a memory device (or memory chip) that provides the input data $r^T$. For example, FIG. 2 illustrates an example where u=6.

In FIG. 2, fv may represent the number of data bits included in one column of the input data $r^T$, and fv may correspond to the number of data bits output from one data I/O pin of the memory device (or memory chip) that provides the input data $r^T$. A column of the input data $r^T$ may be referred to as a lane LN, and two or more consecutive data bits included in one lane LN may be defined as one symbol SB. In addition, f may represent the number of data bits included in one symbol SB, and v may represent the number of the symbols SB included in one lane LN. For example, FIG. 2 illustrates an example where v=3 and f=2.

A first direction DL may represent a formation or arrangement direction of the lanes LN, and a second direction DR may represent a formation or arrangement direction of the rows RW. The first direction DL may be referred to as a lane direction, and the second direction DR may be referred to as a row direction. The input data $r^T$ may include a total of u lanes arranged along the second direction DR, and may include a total of fv rows arranged along the first direction DL.

For example, errors that may occur on the input data $r^T$ may include a burst error and a random bit error.

The burst error may occur on adjacent symbols SBs in one lane LN, and burst errors in the lanes LN may occur independently. In other words, the burst error may represent a subsequent symbol error pattern in the vertical symbol level (e.g., the symbol level in the lane direction), and may be mainly originated from equalizing issues on the high-speed interconnections. FIG. 2 illustrates an example where a single burst error SBST_ERR occurs on two symbols SB in the input data $r^T$.

The random bit error may occur on any location or position in the lanes LN and the rows RW. When random bit errors occur randomly on two or more data bits, it may be referred to as a multi-bit error. In other words, the multi-bit error may represent a randomized error pattern, and may become prevalent by degradation of memory devices. FIG. 2 illustrates an example where a multi-bit error MB_ERR occurs on the input data $r^T$ and errors occur on two data bits, e.g., an example of a two-bit error.

In the ECC decoder 50 according to example embodiments, the parity check matrix H based on the constacyclic code may be used. Thus, the single burst error SBST_ERR, which is generated on two or more symbols SBs arranged along the first direction DL in the input data $r^T$ and each including two or more data bits, may be corrected. In addition, the multi-bit error MB_ERR, which randomly occurs on two or more data bits in the input data $r^T$, may also be corrected. In other words, the ECC decoder 50 may be implemented to simultaneously correct the single burst error SBST_ERR and the multi-bit error MB_ERR. Accordingly, the ECC decoding may be efficiently performed while reducing the performance loss and increasing the reliability.

However, example embodiments are not limited thereto, and the ECC decoder 50 may be implemented to simultaneously detect the single burst error SBST_ERR and the multi-bit error MB_ERR, and to correct at least one of the single burst error SBST_ERR and the multi-bit error MB_ERR. For example, the single burst error SBST_ERR may be detected and corrected, and the multi-bit error MB_ERR may be detected.

In some example embodiments, the input data $r^T$ may be provided from a memory device (or memory chip) by a burst operation in which the plurality of data bits are output through a plurality of data I/O pins based on a single command, and the first direction DL may correspond to a burst length representing a unit of the burst operation. The burst operation will be described with reference to FIGS. 9A and 9B.

For example, the output data c generated based on the input data $r^T$ may be represented by an fuv-length codeword $c=(c_1, \ldots, c_u)$.

Figure 3:
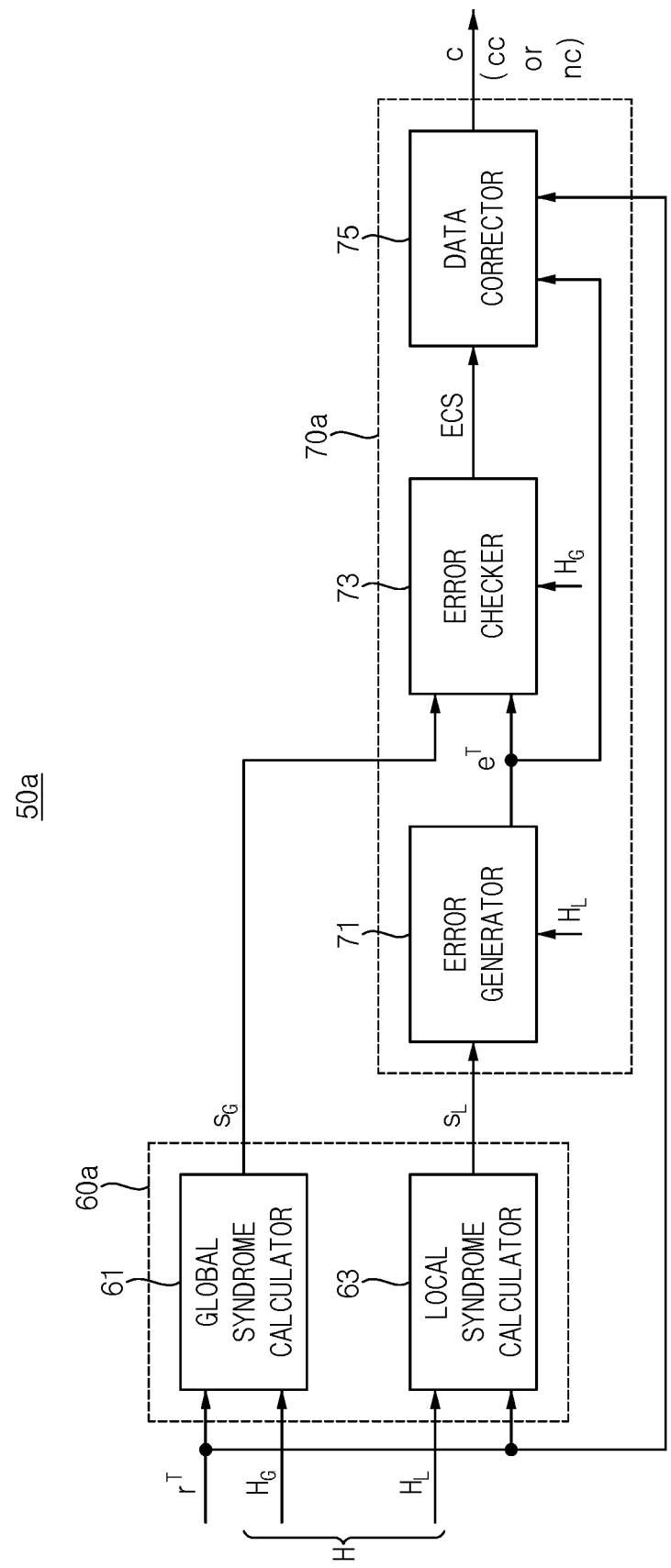
FIG. 3 is a block diagram illustrating an example of an ECC decoder of FIG. 1 according to example embodiments.

FIG. 3 is a block diagram illustrating an example of an ECC decoder of FIG. 1 according to example embodiments.

Referring to FIG. 3, an ECC decoder 50a may include a syndrome generator 60a and a burst error corrector 70a.

The syndrome generator 60a may include a global syndrome calculator 61 and a local syndrome calculator 63. The global syndrome calculator 61 may generate the global syndrome data $S_G$ based on the input data $r^T$ and a global parity check matrix $H_G$ included in the parity check matrix H. The local syndrome calculator 63 may generate the local syndrome data $s_L$ based on the input data $r^T$ and a local parity check matrix $H_L$ included in the parity check matrix H. For example, the global syndrome data $S_G$ and the local syndrome data $s_L$ may be obtained based on Equation 1 and Equation 2. In Equation 1 and Equation 2, $^T$ represents a transpose matrix.

$$s_G = H_G r^T \qquad \text{[Equation 1]}$$

$$s_L = H_L r^T \qquad \text{[Equation 2]}$$

The burst error corrector 70a may include an error generator 71, an error checker 73 and a data corrector 75. The error generator 71 may generate error data $e^T$ based on the local syndrome data $s_L$. The error checker 73 may check whether an error has occurred based on the global syndrome data $s_G$ and the error data $e^T$, and may generate an error check signal ECS indicating whether the error has occurred. The data corrector 75 may generate error corrected data cc or non-corrected data nc based on the error check signal ECS, the input data $r^T$ and the error data $e^T$. For example, when it is determined based on the error check signal ECS that the error has occurred on the input data $r^T$, the data corrector 75 may generate the error corrected data cc based on the input data $r^T$ and the error data $e^T$. When it is determined based on the error check signal ECS that the error has not occurred on the input data $r^T$, the data corrector 75 may output the input data $r^T$ as the non-corrected data nc.

In some example embodiments, at least a part or all of the syndrome generator 60a and the burst error corrector 70a may be implemented as hardware. For example, at least a part or all of the syndrome generator 60a and the burst error corrector 70a may be included in a computer-based electronic system. In other example embodiments, at least a part or all of the syndrome generator 60a and the burst error corrector 70a may be implemented as instruction codes or program routines (e.g., a software program). For example, the instruction codes or the program routines may be executed by a computer-based electronic system, and may be stored in any storage device located inside or outside the computer-based electronic system.

Figure 4:
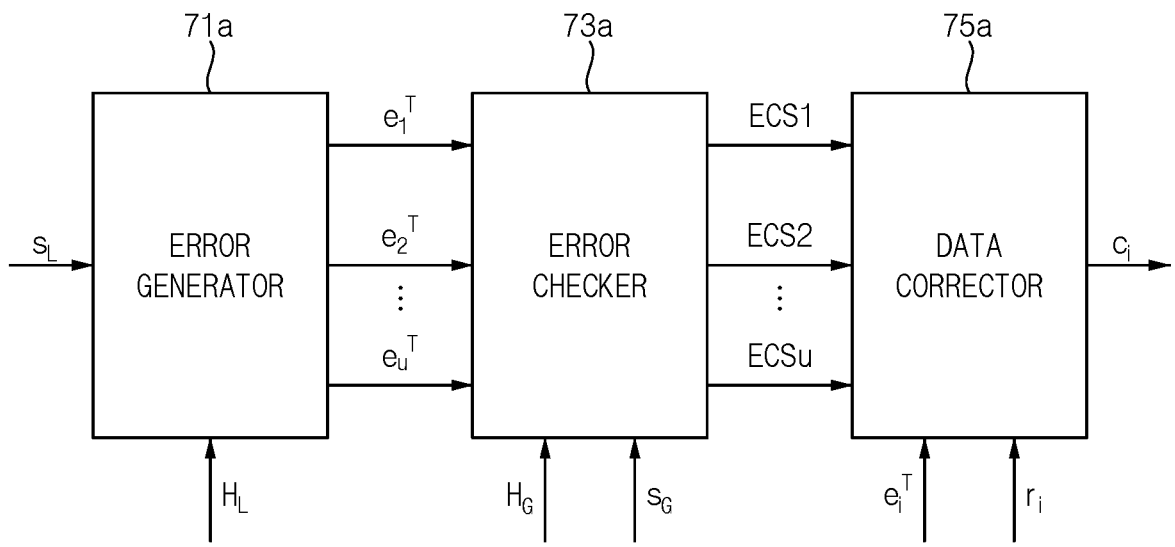
FIG. 4 is a diagram for describing an operation of a burst error corrector included in an ECC decoder of FIG. 3 according to example embodiments.

FIG. 4 is a diagram for describing an operation of a burst error corrector included in an ECC decoder of FIG. 3 according to example embodiments.

Referring to FIGS. 3 and 4, an example of an error correction operation that is performed by an error generator 71a, an error checker 73a and a data corrector 75a included in the burst error corrector 70a is illustrated.

The error generator 71a may generate a plurality of sub error data $e_1^T, e_2^T, \ldots, e_u^T$ included in the error data $e^T$ based on the local syndrome data $s_L$ and the local parity check matrix $H_L$. For example, the sub error data $e_i^T$ may represent a burst error occurred on an i-th lane, where i is an integer greater than or equal to one and less than or equal to u. For example, the sub error data $e_i^T$ may be obtained based on Equation 3.

$$e_i^T = (H_{L,i})^{-1}(s_L)^T \qquad \text{[Equation 3]}$$

In Equation 3, $H_{L,i}$ may denote an i-th sub local parity check matrix among a plurality of sub local parity check matrices included in the local parity check matrix $H_L$. For example, based on Equation 3, $e_1^T = (H_{L,1})^{-1}(s_L)^T$, $e_2^T = (H_{L,2})^{-1}(s_L)^T$, and $e_u^T = (H_{L,u})^{-1}(s_L)^T$.

The error checker 73a may check whether the error has occurred and may generate the error check signal ECS, by comparing the global syndrome data $S_G$ with data obtained by multiplying the global parity check matrix $H_G$ and the error data $e^T$. For example, the global syndrome data $S_G$ may be compared with data obtained by multiplying the global parity check matrix $H_G$ and the sub error data $e_1^T$, $e_2^T, \ldots, e_u^T$, and based on a result of comparison, it may be checked whether the error has occurred and a plurality of error check signals ECS1, ECS2, . . . , ECSu may be generated. For example, when there exists a unique i (i∈ [u]) satisfying Equation 4, it may be checked that the error has occurred and the error correction operation may be performed.

$$s_G = H_{G,i} e_i^T \qquad \text{[Equation 4]}$$

In Equation 4, $H_{G,i}$ may denote an i-th sub global parity check matrix among a plurality of sub global parity check matrices included in the global parity check matrix $H_G$. For example, based on Equation 4, the first error check signal ECS1 indicating that the error has occurred on a first lane may be generated when $s_G = H_{G,1} e_1^T$ is satisfied, the second error check signal ECS2 indicating that the error has occurred on a second lane may be generated when $s_G = H_{G,2} e_2^T$ is satisfied, and the u-th error check signal ECSu indicating that the error has occurred on a u-th lane may be generated when $s_G = H_{G,u} e_u^T$ is satisfied.

When there exists the unique i satisfying Equation 4, the data corrector 75a may perform the error correction operation based on Equation 5.

$$c_i = r_i + e_i^T \qquad \text{[Equation 5]}$$

FIGS. 5, 6A, 6B and 6C are diagrams for describing a parity check matrix based on a constacyclic code used in an ECC decoder of FIG. 3 according to example embodiments.

Figure 5:
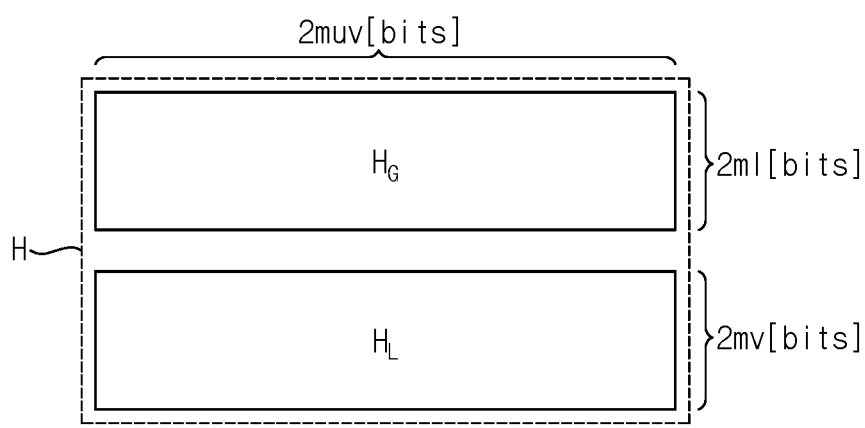

Referring to FIG. 5, an example of a 2m(l+v)*2muv-size parity check matrix H applied to the input data of FIG. 2 is illustrated. In FIG. 5, a symbol size f=2m, m is a positive integer, l is an even integer, and l and m are relatively prime. The parity check matrix H may include a 2 ml*2muv-size global parity check matrix $H_G$ and a 2mv*2muv-size local parity check matrix $H_L$.

Figure 6A:
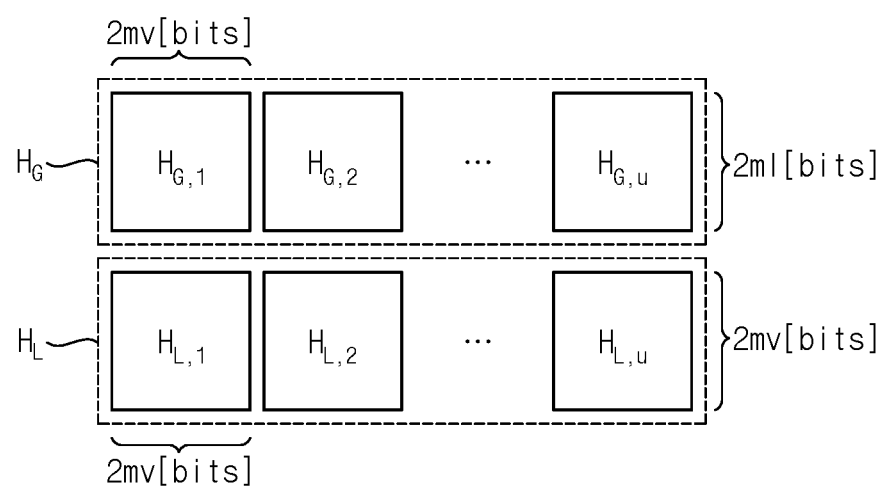

Referring to FIG. 6A, the global parity check matrix $H_G$ may include a plurality of sub global parity check matrices $H_{G,1}, H_{G,2}, \ldots, H_{G,u}$. The number of the sub global parity check matrices $H_{G,1}, H_{G,2}, \ldots, H_{G,u}$ may be u, and a size of one sub global parity check matrix may be 2 ml*2mv. As will be described with reference to FIG. 6B, the sub global parity check matrices $H_{G,1}, H_{G,2}, \ldots, H_{G,u}$ may be implemented in different forms.

The local parity check matrix $H_L$ may include a plurality of sub local parity check matrices $H_{L,1}, H_{L,2}, \ldots, H_{L,u}$. As with the sub global parity check matrices $H_{G,1}, H_{G,2}, \ldots, H_{G,u}$, the number of the sub local parity check matrices $H_{L,1}, H_{L,2}, \ldots, H_{L,u}$ may be u, and a size of one sub local parity check matrix may be 2 ml*2mv. As will be described with reference to FIG. 6C, the sub local parity check matrices $H_{L,1}, H_{L,2}, \ldots, H_{L,u}$ may be implemented in forms similar to each other.

Figure 6B:
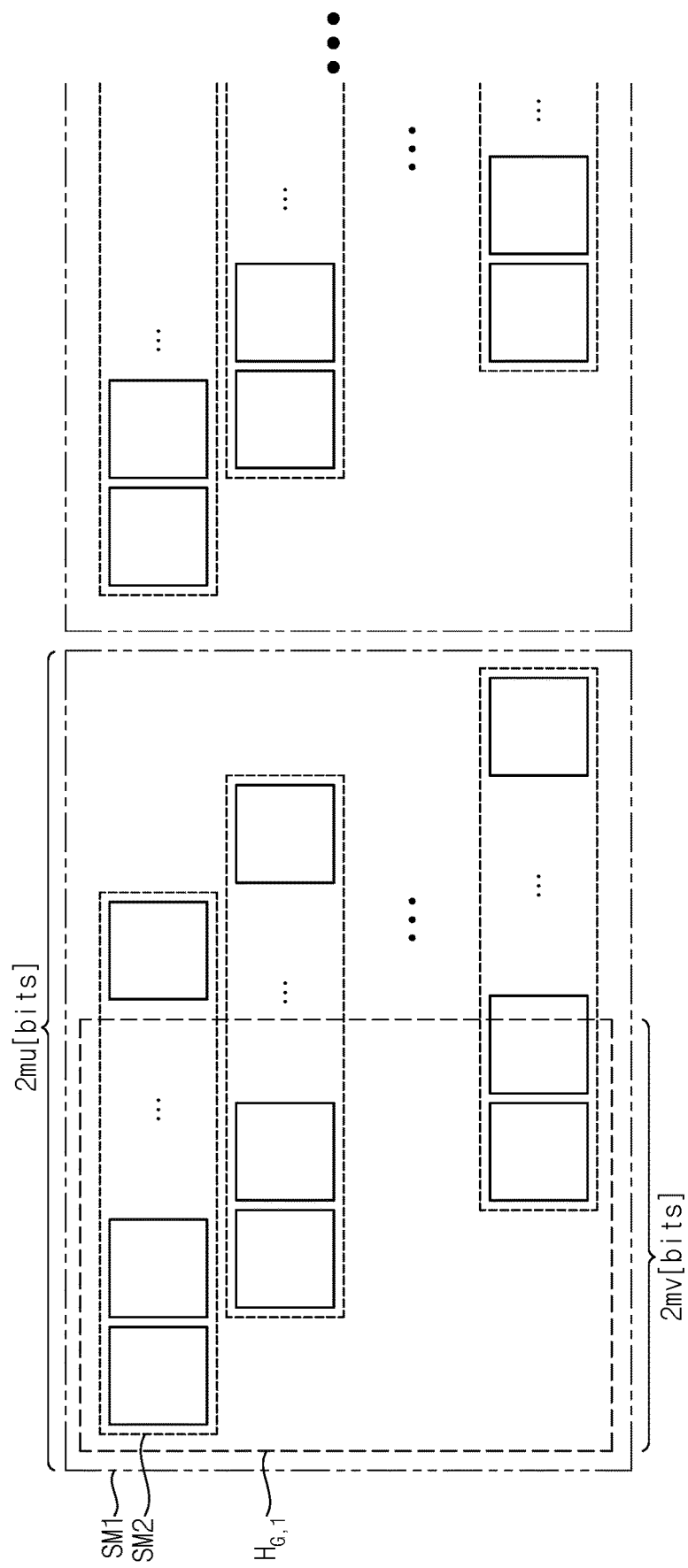

Referring to FIG. 6B, the global parity check matrix $H_G$ may have a structure in which a 2 ml*2mu-size first sub matrix SM1 are repeatedly arranged, and the number of first sub matrices SM1 repeatedly arranged in the global parity check matrix $H_G$ may be v. The first sub matrix SM1 may include a plurality of second sub matrices SM2, the plurality of second sub matrices SM2 may be arranged in the first sub matrix SM1 as illustrated in FIG. 6B, and each second sub matrix SM2 may include elements illustrated by solid rectangles. In the global parity check matrix $H_G$, zero elements may be disposed in regions or areas in which the elements illustrated by solid rectangles are not disposed. A process of obtaining the elements illustrated by solid rectangles will be described later.

In the global parity check matrix $H_G$ in which the v first sub matrices SM1 are repeatedly arranged, the u sub global parity check matrices $H_{G,1}, H_{G,2}, \ldots, H_{G,u}$ may be defined as illustrated in FIG. 6A, and a size of each sub global parity check matrix may be 2 ml*2mv. For example, a 2 ml*2mv-size matrix at the frontmost stage in the frontmost first sub-matrix SM1 may be defined as the first sub global parity check matrix $H_{G,1}$. For example, although not illustrated in detail, a 2 ml*2mv-size matrix adjacent to the first sub global parity check matrix $H_{G,1}$ may be defined as the second sub global parity check matrix $H_{G,2}$. For example, the first sub global parity check matrix $H_{G,1}$ and the second sub global parity check matrix $H_{G,2}$ may have different forms. In detail, for example, the first sub global parity check matrix $H_{G,1}$ may be included in a single first sub matrix SM1, and the second sub global parity check matrix $H_{G,2}$ may overlap two adjacent first sub matrices SM1, but example embodiments are not limited thereto.

Referring to FIG. 6C, the first sub local parity check matrix $H_{L,1}$ included in the local parity check matrix $H_L$ may include elements illustrated by solid rectangles, the second sub local parity check matrix $H_{L,2}$ included in the local parity check matrix $H_L$ may include elements illustrated by solid rectangles, and the u-th sub local parity check matrix $H_{L,u}$ included in the local parity check matrix $H_L$ may include elements illustrated by solid rectangles. A process of obtaining the elements illustrated by solid rectangles will be described later. In each sub local parity check matrix, zero elements may be disposed in regions or areas in which the elements illustrated by solid rectangles are not disposed. For example, the sub local parity check matrices $H_{L,1}, H_{L,2}, \ldots, H_{L,u}$, may have similar forms (e.g., a form corresponding to a diagonal matrix) to each other.

Hereinafter, a method or process of obtaining the parity check matrix H based on the constacyclic code used in example embodiments will be described in detail.

First, some mathematical expressions associated with or related to example embodiments are summarized.

Code operations are based on the a*b matrix A over the binary finite field $\mathbb{F}_2$ or its extended fields $\mathbb{F}_{2^l}$, $\mathbb{F}_{2^m}$, $\mathbb{F}_{2^{2m}}$, and $\mathbb{F}_{2^{lm}}$ for a positive integer m and an even integer l. Also, let α, β, ξ and γ be primitive elements of $\mathbb{F}_{2^l}$, $\mathbb{F}_{2^m}$, $\mathbb{F}_{2^{2m}}$, and $\mathbb{F}_{2^{lm}}$, respectively. It is easy to check that $\mathbb{F}_{2^m}$ is a subfield of $\mathbb{F}_{2^{2m}}$, where $\mathbb{F}_{2^{2m}}$ is also a subfield of $\mathbb{F}_{2^{lm}}$. Then, the corresponding primitive elements should satisfy Equation 6.

$$\beta = \xi^{2^m+1} = \gamma^{(\Sigma_{i \in [0, l-1]} 2^{mi})}, \qquad \text{[Equation 6]}$$

$$\xi = \gamma^{(\Sigma_{i \in [0, \frac{l}{2}-1]} 2^{2mi})}$$

Let $\mathcal{F}$ be a linear map from $\mathbb{F}_{2^m}$ to $\mathbb{F}_{2^{2m}}$, that is, $\mathcal{F}(\beta^i) = \xi^{i(2^m+1)}$, i ⊂ [0, $2^m$−2] and $\mathcal{F}(0)=0$.

Let B be an incidence matrix of A over $\mathbb{F}_{2^m}$, denoted as B=M(A), that is, $b_{i,j}$=1 if $a_{i,j} \neq 0$, and $b_{i,j}$=0 otherwise, where $a_{i,j}$ and $b_{i,j}$ are the (i,j)-th elements of A and B, respectively.

Also, let $T^i$ be a companion matrix denoted by Equation 7.

$$T^i = [[\xi^i], [\xi^{i+1}], \ldots, [\xi^{i+2m-1}]] \in \mathbb{F}_2[T] \subseteq \mathbb{F}_2^{2m \times 2m} \qquad \text{[Equation 7]}$$

In Equation 7, [$\xi^i$] is denoted as a 2m*1 column vector derived from the additive 2m-tuple representation of a finite field with basis $\{1, \xi, \ldots, \xi^{m-1}\}$ for an arbitrary integer i, and $\mathbb{F}_2[T]=\{T^0, T^1, \ldots, T^{2^{2m}-2}\}$. Then, it is easy to check that there exists a field-isomorphic map $\mathcal{I}$ from $\{0, \xi^0, \xi^1, \ldots, \xi^{2^{2m}-2}\}$ to $\{O, T^0, T^1, \ldots, T^{2^{2m}-2}\}$, where O denotes an all-zero matrix.

Next, the parity check matrix H based on the constacyclic code according to example embodiments will be described using the above-described mathematical expressions.

The parity check matrix H based on the constacyclic code according to example embodiments may be obtained by transforming and/or extending a conventional cyclic code (e.g., Fire code) into the constacyclic code.

Before introducing the constacyclic codes, the conventional cyclic codes may be reminded. For the cyclic codes with codelength $n=2^l-1$, encoding and decoding operations are defined over an isomorphic mapping from the algebraic operation over the principal ring $\mathbb{F}_2[x]/<x^n+1>$, where $<.>$ is a generator. Denote $\alpha \in \mathbb{F}_{2^l}$ as a primitive element satisfying $\alpha^{2^l-1}=1$. For the set of root exponents $C=[0, 2^l-2]$, let $C_i=\{\alpha^i, \alpha^{2i}, \ldots, \alpha^{2^{l-1}i}\}$, $|C_i| \leq l$ be a coset, a partition of C. Let $p_i(x)$ be a minimal polynomial of $\alpha^i$ over $\mathbb{F}_2$. Then, Equation 8 may be obtained, where I is a subset of $[0, 2^l-2]$ satisfying $C=\cup_{i\in I} C_i$ with the minimum cardinality.

$$x^n + 1 = (x+1)(\sum_{i=[0,n-1]} x^i) = \prod_{i\in I\setminus\{0\}} (x+1)p_i(x) \quad \text{[Equation 8]}$$

Then, a special class of non-binary constacyclic codes may be proposed as a generalization of cyclic codes, which is defined as follows.

<Definition: Constacyclic codes> For integers m, l and an element $\lambda \in \mathbb{F}_{2^m}$, a 2m-ary linear code $\mathcal{C}$ with codelength $n=2^l-1$ is denoted as $\lambda$-constacyclic if $(\lambda c_n, c_1, \ldots, c_{n-1}) \in \mathcal{C}$ for all $(c_1, c_2, \ldots, c_n) \in \mathcal{C}$.

Similarly, a constacyclic code is defined over an isomorphic mapping to the principal ring $\mathbb{F}_{2^m}[x]/<x^n+\lambda>$. Note that this isomorphism generally holds for any l and m, and the constacyclic code becomes the cyclic code if $\lambda=1$.

Thereafter, the parity check matrix H may be constructed or implemented using the constacyclic code defined as above.

Suppose the primitive roots $\beta$ and $\xi$ over $\mathbb{F}_{2^m}$ and $\mathbb{F}_{2^{2m}}$, satisfying $1<v$ and $\beta=\xi^{n^m+1}$, where l and m are relatively prime. For the principal ring of $<x^{uv}+\lambda^v>$, let $b=2^m+1$ and $\delta=\beta^e=\xi^{e(2^m+1)}=\xi^{eb}$ be a root of $x^u+\lambda$ over $\mathbb{F}_{2^m}$ for $u=2^l-1$ and some integer e. From an (n,k)=(uv,uv−l−v) constacyclic code $\mathcal{C}_p$, a linear binary BECC (burst error control code) $\mathcal{C}_{prop}$ with (n,k)=(fuv,f(uv−l−v)) for a symbol size f=2m has a 2m(l+v)*2muv parity check matrix $$H_{C_{prop}} = \begin{bmatrix} H_G \\ H_L \end{bmatrix},$$

where $H_G=[H_{G,1}, \ldots, H_{G,u}]$ and $H_L=[H_{L,1}, \ldots, H_{L,u}]$ are constructed as following procedures.

i) Let $\mathcal{C}_1$ be a constacyclic code over $\mathbb{F}_{2^m}$ with the parity check polynomial h(x), which is derived as Equation 9.

$$h(x) = \frac{x^u + \lambda}{p'_i(\delta^{-1}x)} = \prod_{j\in I\setminus\{i\}} p'_j(\delta^{-1}x) \quad \text{[Equation 9]}$$
$$= \prod_{i\in[0,u-l]} h_i x^i, h_i \in \mathbb{F}_{2^m}$$

For example, as a methodology for defining the constacyclic code, $\delta$ included $\mathbb{F}_{2^m}$, which is a solution of $x^u+\lambda=0$ may be obtained, and then the parity check polynomial of Equation 9 may be derived. Here, $p_i(x)$ may be a minimal polynomial of $x^u+1$.

ii) An l*uv-size $P_G$ and an l*uv-size $P'_U$ may be generated based on Equation 10 and Equation 11, using the coefficient of perity check polynomial h(x).

$$P_G = [P'_U, \delta^v P'_U, \ldots, \delta^{v(u-1)} P'_U] \quad \text{[Equation 10]}$$

$$P'_U = \begin{bmatrix} h_0 & h_1 & \ldots & h_{u-l} & 0 & \ldots & 0 \\ 0 & h_0 & \ldots & h_{u-l-1} & h_{u-l} & \ldots & 0 \\ \ldots & \ldots & \ldots & \ldots & \ldots & \ldots & \ldots \\ 0 & 0 & \ldots & h_{u-2l+1} & h_{u-2l+2} & \ldots & h_{u-l} \end{bmatrix} \quad \text{[Equation 11]}$$

For example, for each coefficient of the polynomial, $P_G$ may be set as Equation 10, and $P'_U$ may be constructed as Equation 11 using the coefficient of h(x) defined above.

iii) A v*uv-size $P_L$ may be constructed based on Equation 12 and Equation 13.

$$P_L = [P_{L,1}, \ldots, P_{L,u}] \quad \text{[Equation 12]}$$

$$P_{L,i} = \begin{bmatrix} \delta^{v(i-1)} & 0 & \ldots & 0 \\ 0 & \delta^{v(i-1)} & \ldots & 0 \\ \ldots & \ldots & \ldots & \ldots \\ 0 & 0 & \ldots & \delta^{v(i-1)} \end{bmatrix} \quad \text{[Equation 13]}$$

Thus, an (l+v)*uv-size matrix $$P = \begin{bmatrix} P_G \\ P_L \end{bmatrix}$$

may be generated from $P_G$ and $P_L$. Then, P is a parity check matrix of the constacyclic code $\mathcal{C}_p$ with the generator polynomial $g(x)=(\delta^{-v}x^v+1)p'_i(\delta^{-1}x)$ over $\mathbb{F}_{2^m}$. Elements of P may be included in $\mathbb{F}_{2^m}$.

iv) From the constacyclic code $\mathcal{C}_p$, convert all the elements by two sequential maps $\mathcal{I} \circ \mathcal{F}$ to binary elements. First, the map $\mathcal{F}$ converts $\beta^i$ to $\xi^{bi}$ and $\delta^i=\beta^{ei}$ to $\xi^{bei}$. Then, the elements of $\xi^i$ are mapped into 2m*2m companion matrices by $\mathcal{I}(\xi^i)=T^i$, e.g., using Equation 7 and the field-isomorphic map $\mathcal{I}$. Finally, the proposed binary BECC is constructed with a 2m(l+v)*2muv parity check matrix $Hc_{prop}$, which corresponds to the parity check matrix H based on the constacyclic code described with reference to FIGS. 5, 6A, 6B and 6C.

In summary, the parity check matrix H may be obtained based on the parity check polynomial h(x) of Equation 9, the global parity check matrix $H_G$ included in the parity check matrix H may be constructed based on Equation 10 and Equation 11, and the local parity check matrix $H_L$ included in the parity check matrix H may be constructed based on Equation 12 and Equation 13. Particularly, the global parity check matrix $H_G$ and the local parity check matrix $H_L$ may be obtained by converting all elements in $P_G$ of Equation 10 and $P_L$ of Equation 12 into binary elements using the companion matrix defined by Equation 7.

The ECC decoder 50 according to example embodiments may operate using the parity check matrix H based on the constacyclic code, and may simultaneously detect and/or correct the single burst error SBST_ERR and the multi-bit error MB_ERR. Therefore, the ECC decoder 50 may have relatively robust structure even in terms of multi-bit errors, which have not been considered in the past. Accordingly, the ECC decoding may be efficiently performed while reducing the performance loss and increasing the reliability.

In some example embodiments, the ECC decoder 50 may be implemented in the form of a maximum likelihood syndrome decoder (MLSD), but example embodiments are not limited thereto.

Figure 7:
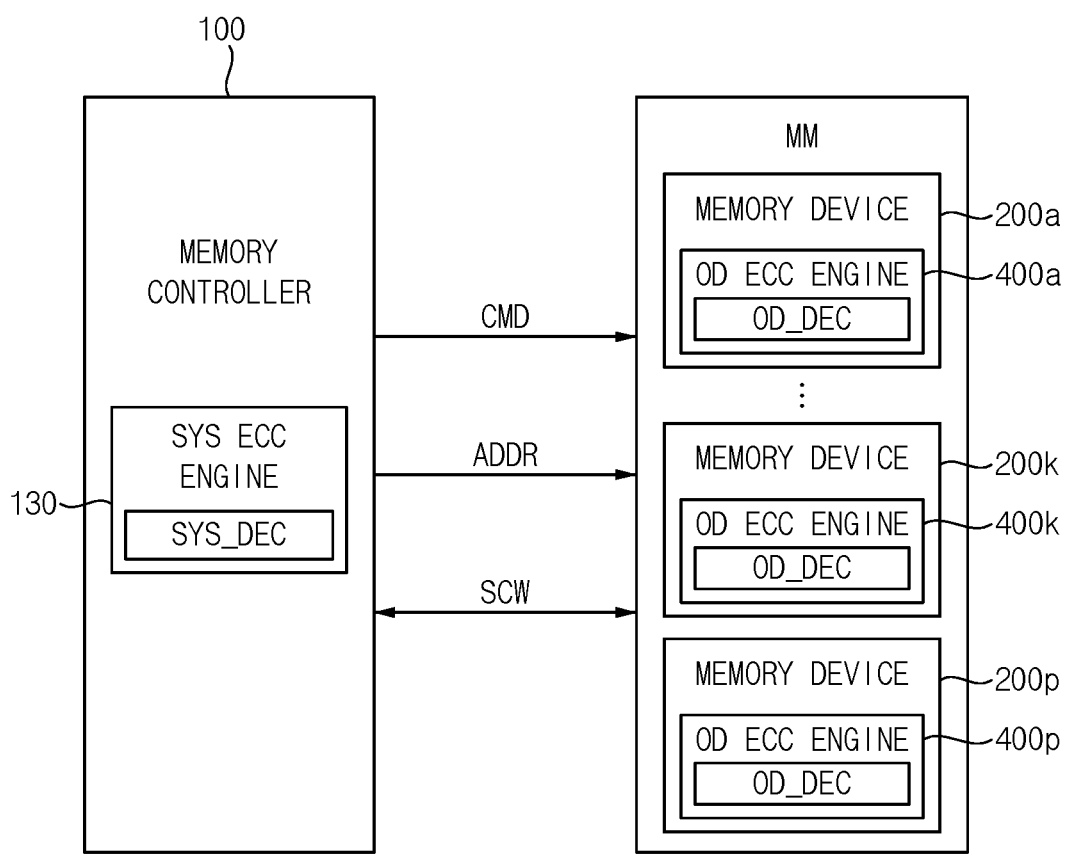
FIG. 7 is a block diagram illustrating a memory device and a memory system according to example embodiments.

FIG. 7 is a block diagram illustrating a memory device and a memory system according to example embodiments.

Referring to FIG. 7, a memory system 10 may include a memory controller 100 and a memory module MM. The memory module MM may include a plurality of memory devices 200a, . . . , 200k and 200p. The plurality of memory devices 200a, . . . , 200k and 200p may be a plurality of memory chips 200a, . . . , 200k and 200p. The plurality of memory chips 200a to 200k may be a plurality of data chips 200a to 200k and the memory chip 200p may be at least one parity chip 200p. Each of the plurality of memory chips 200a to 200k and 200p may be referred to as a semiconductor memory device.

The memory controller 100 may control an overall operation of the memory system 10. The memory controller 100 may control an overall data exchange between an external host device and the plurality of memory chips (or memory devices) 200a to 200k and 200p. For example, the memory controller 100 may write data in the plurality of memory chips 200a to 200k and 200p and/or read data from the plurality of memory chips 200a to 200k and 200p in response to a request from the host. Alternatively or additionally, the memory controller 100 may issue operation commands to the plurality of memory chips 200a to 200k and 200p for controlling the plurality of memory chips 200a to 200k and 200p.

In some example embodiments, each of the plurality of memory chips 200a to 200k and 200p may include a volatile memory including volatile memory cells, such as a dynamic random access memory (DRAM).

In some example embodiments, the number of the plurality of data chips 200a to 200k may be eight or sixteen. However, the number of the data chips 200a to 200k is not limited thereto, and may be more than eight or sixteen, or less than eight or sixteen, and may be a power of two, or may not be a power of two. In some example embodiments, each of the data chips 200a to 200k may be referred to as a data memory device, and the at least one parity chip 200p may be referred to as a parity memory device, an ECC memory device or a redundant memory device.

The memory controller 100 may transmit a command CMD and an address ADDR to the memory module MM, and may exchange a codeword set SCW with the memory module MM.

The memory controller 100 may include a system (SYS) ECC engine (or a first ECC engine) 130. Each of the plurality of memory chips 200a to 200k and 200p may include a respective one of a plurality of on-die (OD) ECC engines (or second ECC engines) 400a to 400k, and 400p.

The system ECC engine 130 may include a system ECC decoder (or a first ECC decoder) SYS_DEC that performs an ECC decoding. Each of the on-die ECC engines 400a to 400k and 400p may include an on-die ECC decoder (or a second ECC decoder) OD_DEC that performs an ECC decoding. Each of the system ECC decoder SYS_DEC and the on-die ECC decoder OD_DEC may be the ECC decoder according to example embodiments described with reference to FIGS. 1 through 6, may operate based on the parity check matrix H based on the constacyclic code, and thus may be implemented to simultaneously detect and/or correct the single burst error SBST_ERR and the multi-bit error MB_ERR.

Figure 8:
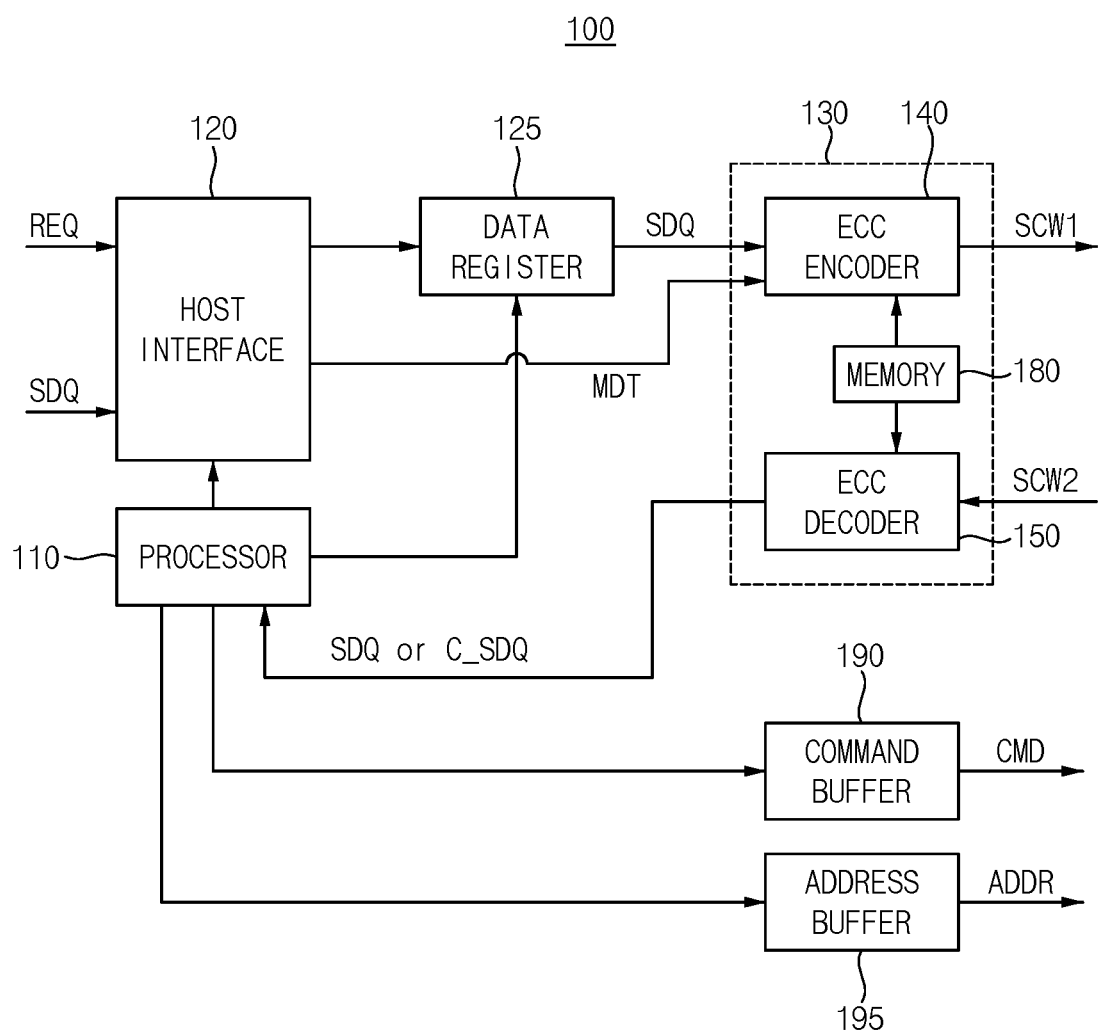
FIG. 8 is a block diagram illustrating an example of a memory controller included in a memory system of FIG. 7 according to example embodiments.

FIG. 8 is a block diagram illustrating an example of a memory controller included in a memory system of FIG. 7 according to example embodiments.

Referring to FIG. 8, a memory controller 100 may include a processor 110, a host interface 120, a data register 125, a system ECC engine 130, a command buffer 190 and an address buffer 195. The system ECC engine 130 may include an ECC encoder 140, an ECC decoder 150 and a memory 180.

The host interface 120 may receive a request REQ and a user data set (or main data) SDQ from an external host device, may generate meta data MDT associated with the user data set SDQ, may provide the user data set SDQ to the data register 125, and may provide the meta data MDT to the ECC encoder 140. The data register 125 may continuously (and/or sequentially and/or serially) output the user data set SDQ to the ECC encoder 140.

During a write operation, the ECC encoder 140 may generate a first codeword set (or simply codeword) SCW1 by performing an ECC encoding on the user data set SDQ and the meta data MDT using a parity generation matrix. The first codeword set SCW1 may correspond to write data that is provided to the memory module MM and is stored in the memory module MM.

The ECC decoder 150 may correspond to the system ECC decoder SYS_DEC in FIG. 7. During a read operation, the ECC decoder 150 may generate the user data set SDQ and/or a corrected user data set C_SDQ by performing an ECC decoding on a second codeword set SCW2 using a parity check matrix, and may provide the user data set SDQ and/or the corrected user data set C_SDQ to the processor 110. The second codeword set SCW2 may correspond to read data that is received or retrieved from the memory module MM, and may correspond to the input data $r^T$ in FIG. 1.

The memory 180 may store the parity generation matrix (or a generator matrix) and the parity check matrix. For example, the parity check matrix may be the parity check matrix H based on the constacyclic code according to example embodiments. For example, the generator matrix is used for converting data into codeword set, and the parity check matrix is used to decode codeword set to find whether or not there are errors in the codeword set.

The processor 110 may receive the user data set SDQ and/or the corrected user data set C_SDQ, and may control the system ECC engine 130, the command buffer 190 and/or the address buffer 195. For example, the processor 110 may include a central processing unit (CPU).

The command buffer 190 may store the command CMD corresponding to the request REQ, and may transmit the command CMD to the memory module MM under a control of the processor 110. The address buffer 195 may store the address ADDR, and may transmit the address ADDR to the memory module MM under a control of the processor 110.

Figure 9B:
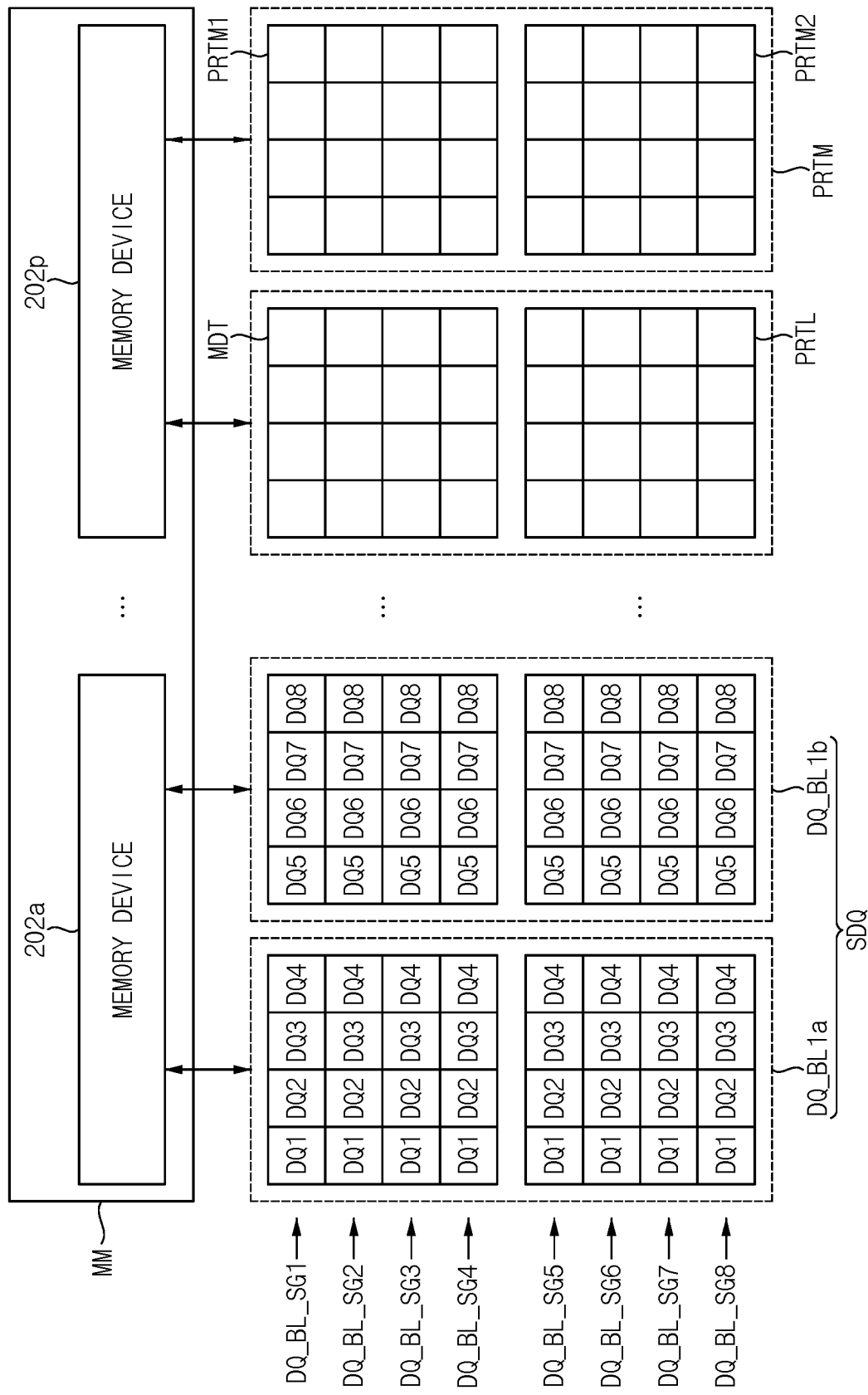

FIGS. 9A and 9B are diagrams illustrating examples of data sets corresponding to a plurality of burst lengths in a memory system of FIG. 7 according to example embodiments.

Referring to FIG. 9A, a memory module MM may include a plurality of memory devices (or memory chips) 201a to 201k, 201pa and 201pb. The plurality of memory chips 201a to 201k may be a plurality of data chips 201a to 201k. The memory chips 201pa and 201pb may be a first parity chip 201pa and a second parity chip 201pb. For example, the plurality of data chips 201a to 201k may include first to N-th data chips, where N is a natural number equal to or greater than two. In the example of FIG. 9A, one memory chip may be connected to four data input/output (I/O) pins, and four data signals DQ1, DQ2, DQ3 and DQ4 may be input to and/or output from one memory chip. The example of FIG. 9A may be referred to as ×4 structure.

As illustrated in FIG. 9A, each of the data chips 201a to 201k and the parity chips 201pa and 201pb may perform a burst operation.

Herein, a burst operation may represent an operation of writing and/or reading a large amount of data by sequentially increasing and/or decreasing an initial address provided from the memory controller 100. A basic unit of the burst operation may be referred to a burst length (BL).

Each of data sets DQ_BL1, ..., and DQ_BLk corresponding to a plurality of burst lengths may be input to and/or output from each of the data chips 201a to 201k. Each of the data sets DQ_BL1 to DQ_BLk may include data segments DQ_BL_SG1, DQ_BL_SG2, DQ_BL_SG3, DQ_BL_SG4, DQ_BL_SG5, DQ_BL_SG6, DQ_BL_SG7 and DQ_BL_SG8 corresponding to each of the plurality of burst lengths. The data sets DQ_BL1 to DQ_BLk may correspond to the user data set SDQ. For example, FIG. 9A illustrates an example where the burst length is eight, however, example embodiments are not limited thereto.

While the burst operation is performed on each of the data chips 201a to 201k, the meta data MDT and a first parity data PRTL corresponding to the plurality of burst lengths may be input to and/or output from the first parity chip 201pa, and a second parity data PRTM corresponding to the plurality of burst lengths may be input to and/or output from the second parity chip 201pb. The second parity data PRTM may include a first sub parity data PRTM1 and a second sub parity data PRTM2.

The first parity data PRTL may be referred to as error locator parity data, and may be associated with locations of error bits in the user data set SDQ. The second parity data PRTM may be referred to as error magnitude parity data, and may be associated with magnitudes (or numbers or counts) of the error bits in the user data set SDQ. FIG. 9A illustrates an example where the error locator parity data and the error magnitude parity data are stored in different parity chips. For example, the first parity data PRTL, e.g., the error locator parity data may correspond to the global parity check matrix and the global parity data generated based on the global parity check matrix, and the second parity data PRTM, e.g., the error magnitude parity data may correspond to the local parity check matrix and the local parity data generated based on the local parity check matrix.

Referring to FIG. 9B, a memory module MM may include a plurality of memory devices 202a, ..., and 202p. The descriptions repeated with FIG. 9A will be omitted.

The memory device 202a may include a plurality of memory chips 202a. The plurality of memory chips 202a may be a plurality of data chips 202a, for example, a first data chip and a second data chip. The memory device 202p may include a plurality of memory chips 202p. The plurality of memory chips 202p may be a plurality of parity chips 202p, for example, a first parity chip and a second parity chip. For example, the plurality of data chips 202a may include first to M-th data chips, where M is a natural number equal to or greater than two. In the example of FIG. 9B, one memory chip may be connected to eight data I/O pins, and eight data signals DQ1, DQ2, DQ3, DQ4, DQ5, DQ6, DQ7 and DQ8 may be input to and/or output from one memory chip. The example of FIG. 9B may be referred to as ×8 structure.

The size of data sets DQ_BL1a and DQ_BL1b that are input to and/or output from one memory chip in FIG. 9B may be twice the size of the data set DQ_BL1 that are input to and/or output from one memory chip in FIG. 9A. When the memory module MM of FIG. 9A and the memory module MM of FIG. 9B include the same number of data I/O pins, the number of the data chips 202a in FIG. 9B may be a half of the number of the data chips 201a to 201k in FIG. 9A (e.g., M=N/2). For example, N=16 and M=8. In addition, FIG. 9B illustrates an example where the error locator parity data and the error magnitude parity data are stored in one parity chip.

Figure 10:
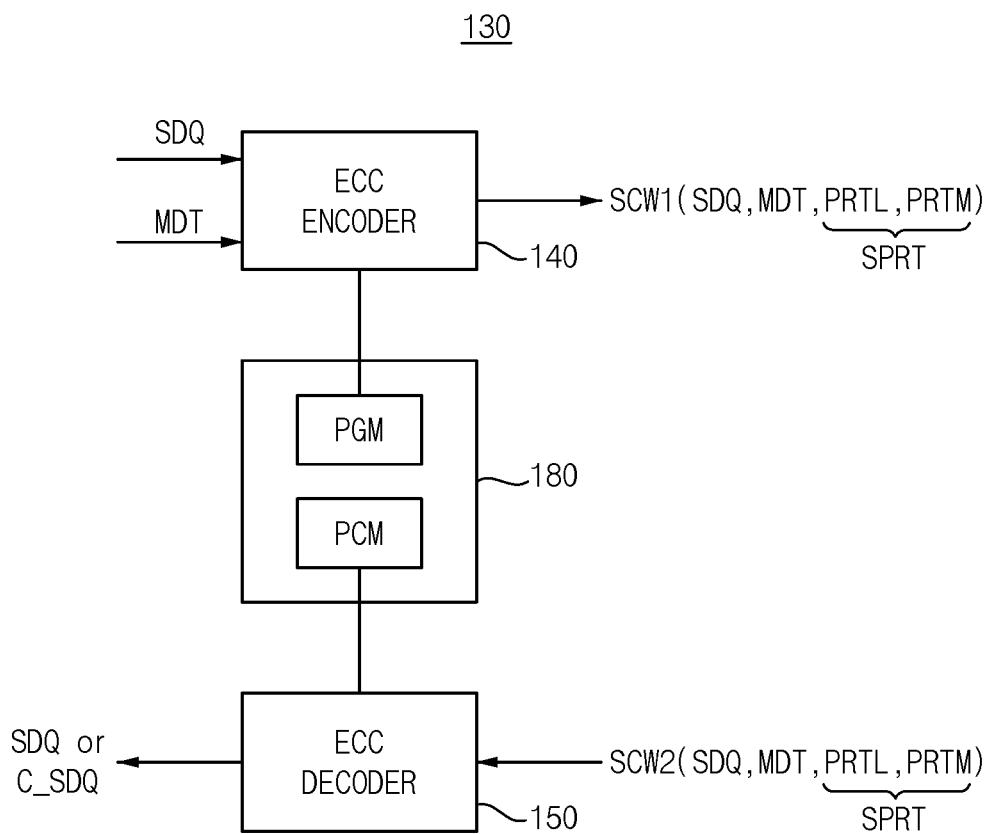
FIG. 10 is a block diagram illustrating an example of a system ECC engine included in a memory controller of FIG. 8 according to example embodiments.

FIG. 10 is a block diagram illustrating an example of a system ECC engine included in a memory controller of FIG. 8 according to example embodiments.

Referring to FIG. 10, a system ECC engine 130 may include an ECC encoder 140, an ECC decoder 150 and a memory 180. The memory 180 may be referred to as an ECC memory. Although the ECC encoder 140 and the ECC decoder 150 are illustrated as separate components, example embodiments are not limited thereto.

During the write operation, the ECC encoder 140 may perform the ECC encoding on the user data set SDQ and the meta data MBT using a parity generation matrix (or a generator matrix) PGM to generate a parity data set SPRT including the first parity data PRTL and the second parity data PRTM, and may output the first codeword set SCW1 including the user data set SDQ, the meta data MBT and the parity data set SPRT. The user data set SDQ may be stored in data chips (e.g., the data chips 201a to 201k in FIG. 9A), and the meta data MDT and the parity data set SPRT may be stored in parity chips (e.g., the parity chips 201pa and 201pb in FIG. 9A).

During the read operation, the ECC decoder 150 may perform the ECC decoding on the second codeword set SCW2 including the user data set SDQ, the meta data MBT and the parity data set SPRT using a parity check matrix PCM to generate the corrected user data set C_SDQ, and may output the user data set SDQ and/or the corrected user data set C_SDQ. The parity check matrix PCM may be the parity check matrix H based on the constacyclic code according to example embodiments, and may be implemented as described with reference to FIGS. 5, 6A, 6B and 6C.

Figure 11:
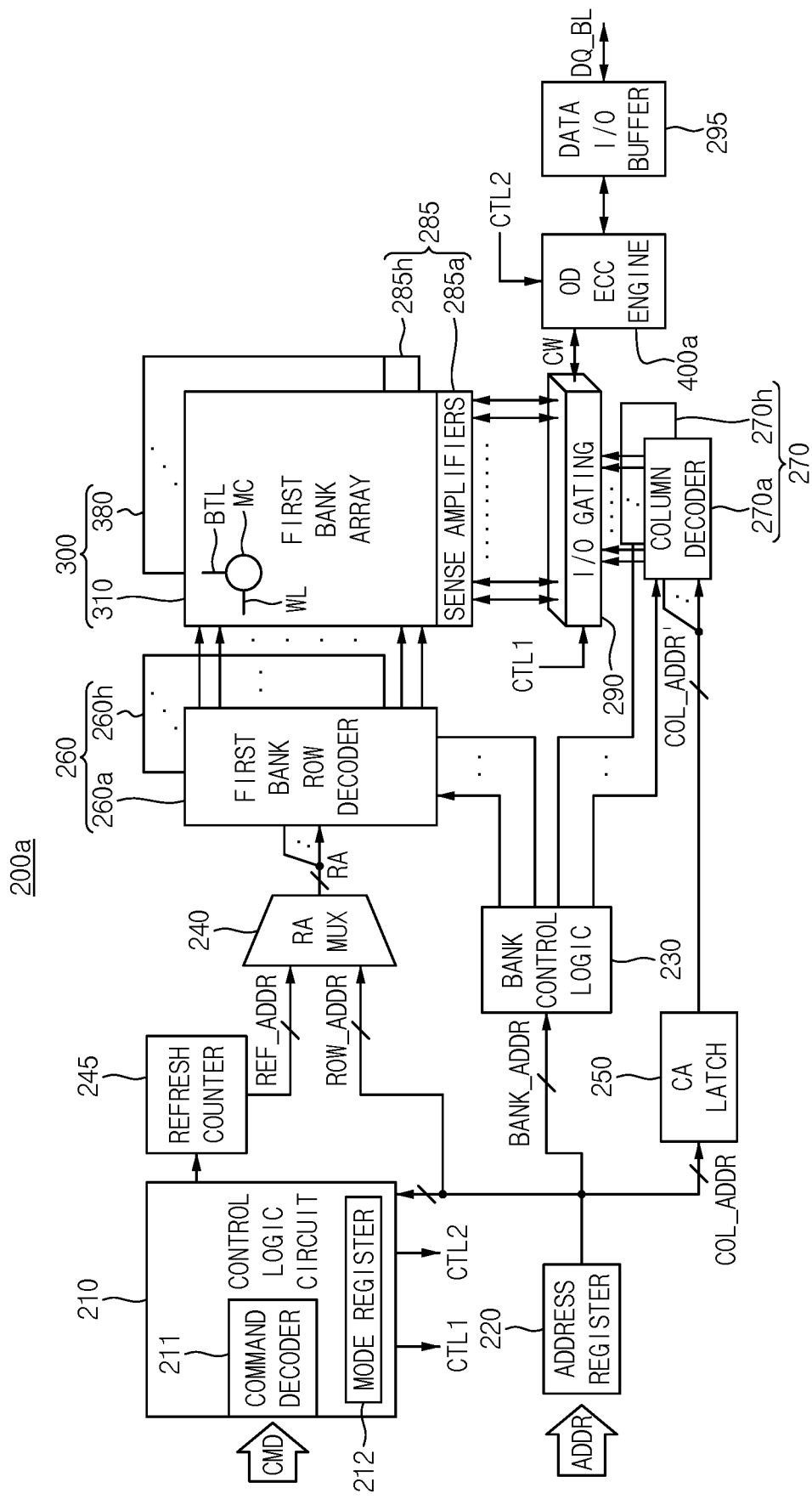
FIG. 11 is a block diagram illustrating an example of a data chip included in a memory module included in a memory system of FIG. 7 according to example embodiments.

FIG. 11 is a block diagram illustrating an example of a data chip included in a memory module included in a memory system of FIG. 7 according to example embodiments.

Referring to FIG. 11, a data chip 200a may include a control logic circuit 210, an address register 220, a bank control logic circuit 230, a row address multiplexer 240, a column address latch 250, a row decoder 260, a column decoder 270, a memory cell array 300, a sense amplifier unit 285, an input/output (I/O) gating circuit 290, a data I/O buffer 295, an on-die ECC engine 400a and/or a refresh counter 245. The data chip 200a of FIG. 11 may correspond to the data chip 200a of FIG. 7, the data chip 201a of FIG. 9A or the data chip 202a of FIG. 9B.

The memory cell array 300 may include first to eighth bank arrays 310 to 380 (e.g., first to eighth bank arrays 310, 320, 330, 340, 350, 360, 370 and 380). The row decoder 260 may include first to eighth bank row decoders 260a to 260h connected respectively to the first to eighth bank arrays 310 to 380. The column decoder 270 may include first to eighth bank column decoders 270a to 270h connected respectively to the first to eighth bank arrays 310 to 380. The sense amplifier unit 285 may include first to eighth bank sense amplifiers 285a to 285h connected respectively to the first to eighth bank arrays 310 to 380.

The first to eighth bank arrays 310 to 380, the first to eighth bank row decoders 260a to 260h, the first to eighth bank column decoders 270a to 270h, and the first to eighth bank sense amplifiers 285a to 285h may form first to eighth banks. Each of the first to eighth bank arrays 310 to 380 may include a plurality of wordlines WL, a plurality of bitlines BTL, and a plurality of memory cells MC that are at intersections of the wordlines WL and the bitlines BTL.

Although FIG. 11 illustrates the data chip 200a including eight banks (and eight bank arrays, eight row decoders, and so on), the data chip 200a may include any number of banks; for example, one, two, four, eight, sixteen, or thirty two banks, or any number therebetween one and thirty two.

The address register 220 may receive the address ADDR including a bank address BANK_ADDR, a row address ROW_ADDR and a column address COL_ADDR from the memory controller 100. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first to eighth bank row decoders 260a to 260h corresponding to the bank address BANK_ADDR may be activated in response to the bank control signals, and one of the first to eighth bank column decoders 270a to 270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first to eighth bank row decoders 260a to 260h.

The activated one of the first to eighth bank row decoders 260a to 260h may decode the row address RA that is output from the row address multiplexer 240, and may activate a wordline WL corresponding to the row address RA. For example, the activated bank row decoder may generate a wordline driving voltage, and may apply the wordline driving voltage to the wordline WL corresponding to the row address RA.

The column address latch 250 may receive the column address COL_ADDR from the address register 220, and may temporarily store the received column address COL_ADDR. In some example embodiments, in a burst mode, the column address latch 250 may generate column addresses COL_ADDR' that increment from the received column address COL_ADDR. The column address latch 250 may apply the temporarily stored or generated column address COL_ADDR' to the first to eighth bank column decoders 270a to 270h.

The activated one of the first to eighth bank column decoders 270a to 270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first to eighth bank arrays 310 to 380, and may also include write control devices for writing data to the first to eighth bank arrays 310 to 380.

A codeword CW read from one of the first to eighth bank arrays 310 to 380 may be sensed by a sense amplifier connected to the one bank array from which the codeword CW is to be read, and may be stored in the read data latches. The codeword CW stored in the read data latches may be provided to the memory controller 100 via the data I/O buffer 295 after the on-die ECC engine 400a performs an ECC decoding on the codeword CW. The codeword CW may be provided to the memory controller 100 as data set (or user data or main data) DQ_BL.

The data set DQ_BL to be written in one of the first to eighth bank arrays 310 to 380 may be provided to the data I/O buffer 295 from the memory controller 100, and may be provided to the on-die ECC engine 400a from the data I/O buffer 295. The on-die ECC engine 400a may perform an ECC encoding on the data set DQ_BL to generate parity data, the on-die ECC engine 400a may provide the codeword CW including the data set DQ_BL and the parity data to the I/O gating circuit 290, and the I/O gating circuit 290 may write the codeword CW in a sub-page of a target page in one bank array through the write drivers.

The data I/O buffer 295 may provide the data set DQ_BL from the memory controller 100 to the on-die ECC engine 400a in a write operation of the data chip 200a, and may provide the data set DQ_BL from the on-die ECC engine 400a to the memory controller 100 in a read operation of the data chip 200a.

The on-die ECC engine 400a may provide an error generation signal EGS to the control logic circuit 210 when the ECC decoding is performed and at least one error bit is detected. In addition, the on-die ECC engine 400a may generate a decoding status flag DSF including information associated with the uncorrectable error or errors that are uncorrectable by the on-die ECC engine 400a, and the correctable error or errors that are correctable by the on-die ECC engine 400a.

The control logic circuit 210 may control operations of the data chip 200a. For example, the control logic circuit 210 may generate control signals for the data chip 200a to perform the write operation and/or the read operation. The control logic circuit 210 may include a command decoder 211 that decodes the command CMD received from the memory controller 100, and a mode register 212 that sets an operation mode of the data chip 200a. In some example embodiments, operations described herein as being performed by the control logic circuit 210 may be performed by processing circuitry.

For example, the command decoder 211 may generate the control signals corresponding to the command CMD by decoding a write enable signal, a row address strobe signal, a column address strobe signal, a chip select signal, etc. For example, the control logic circuit 210 may generate a first control signal CTL1 for controlling the I/O gating circuit 290, and a second control signal CTL2 for controlling the on-die ECC engine 400a.

The parity chip 200p in FIG. 7 may have the same or substantially the same configuration as the data chip 200a. The parity chip 200p may input/output a corresponding parity data.

Figure 12:
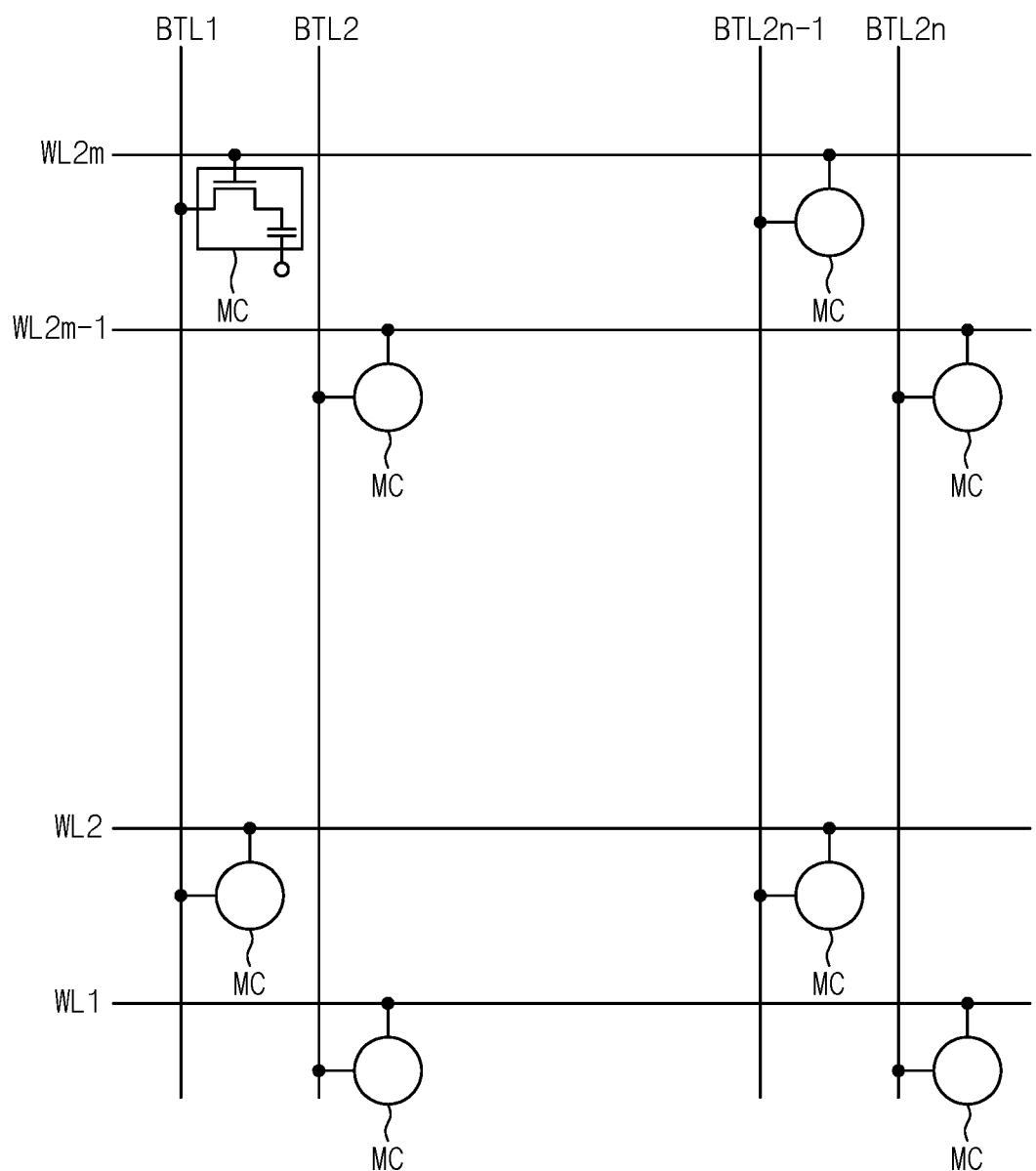
FIG. 12 is a diagram illustrating an example of a bank array included in a data chip of FIG. 11 according to example embodiments.

FIG. 12 is a diagram illustrating an example of a bank array included in a data chip of FIG. 11 according to example embodiments.

Referring to FIG. 12, a first bank array 310 may include a plurality of wordlines WL1, WL2, ..., WL2m-1, and WL2m (where m is a natural number greater than or equal to two), a plurality of bitlines BTL1, BTL2, ..., BTL2n-1, and BTL2n (where n is a natural number greater than or equal to two that may or may not be the same as m), and a plurality of memory cells MC arranged at or near intersections between the wordlines WL1 to WL2m and the bitlines BTL1 to BTL2n. For example, each of the plurality of memory cells MC may include a DRAM cell structure. The plurality of wordlines WL1 to WL2m to which the plurality of memory cells MC are connected may be referred to as rows of the first bank array 310, and the plurality of bitlines BTL1 to BTL2n to which the plurality of memory cells MC are connected may be referred to as columns of the first bank array 310.

Figure 13:
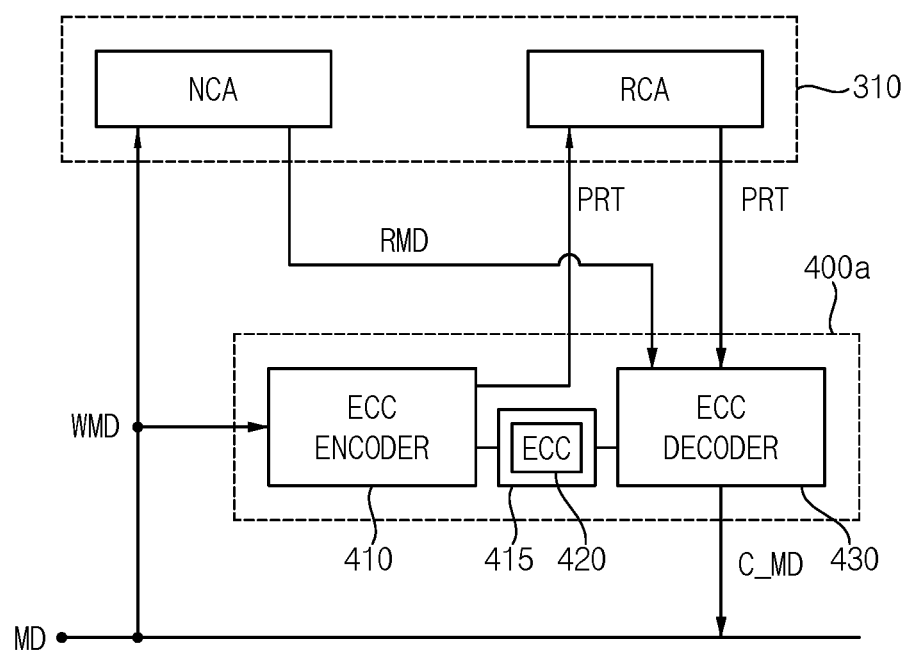
FIG. 13 is a block diagram illustrating an example of an on-die ECC engine included in a memory module included in a memory system of FIG. 7 according to example embodiments.

FIG. 13 is a block diagram illustrating an example of an on-die ECC engine included in a memory module included in a memory system of FIG. 7 according to example embodiments.

Referring to FIG. 13, an on-die ECC engine 400a may include an ECC encoder 410, a memory 415 and an ECC decoder 430.

The memory 415 may store a matrix 420 related to performing ECC. For example, the matrix 420 may include a parity generation matrix (or a generator matrix) and a parity check matrix.

During the write operation, the ECC encoder 410 may generate parity data PRT associated with write data WMD to be stored in a normal cell array NCA of the first bank array 310, using the parity generation matrix. The parity data PRT may be stored in a redundancy cell array RCA of the first bank array 310. For example, the write data WMD and the parity data PRT associated with write data WMD may correspond to the codeword CW output from the on-die ECC engine 400a of FIG. 11.

The ECC decoder 430 may correspond to the on-die ECC decoder OD_DEC in FIG. 7. During the read operation, the ECC decoder 430 may perform the ECC decoding on read data RMD based on the read data RMD and the parity data PRT read respectively from the normal cell array NCA and redundant cell array RCA of the first bank array 310, using the parity check matrix. For example, the read data RIMD and the parity data PRT read from the redundant cell array RCA may correspond to the codeword CW input to the on-die ECC engine 400a of FIG. 11. When the read data RIMD includes at least one error bit as a result of the ECC decoding, the ECC decoder 430 may correct the error bit in the read data RMD and output corrected main data C_MD in a read operation. The read data RMD may correspond to the input data $r^T$ in FIG. 1. For example, the parity check matrix may be the parity check matrix H based on the constacyclic code according to example embodiments, and may be implemented as described with reference to FIGS. 5, 6A, 6B and 6C.

Figure 14:
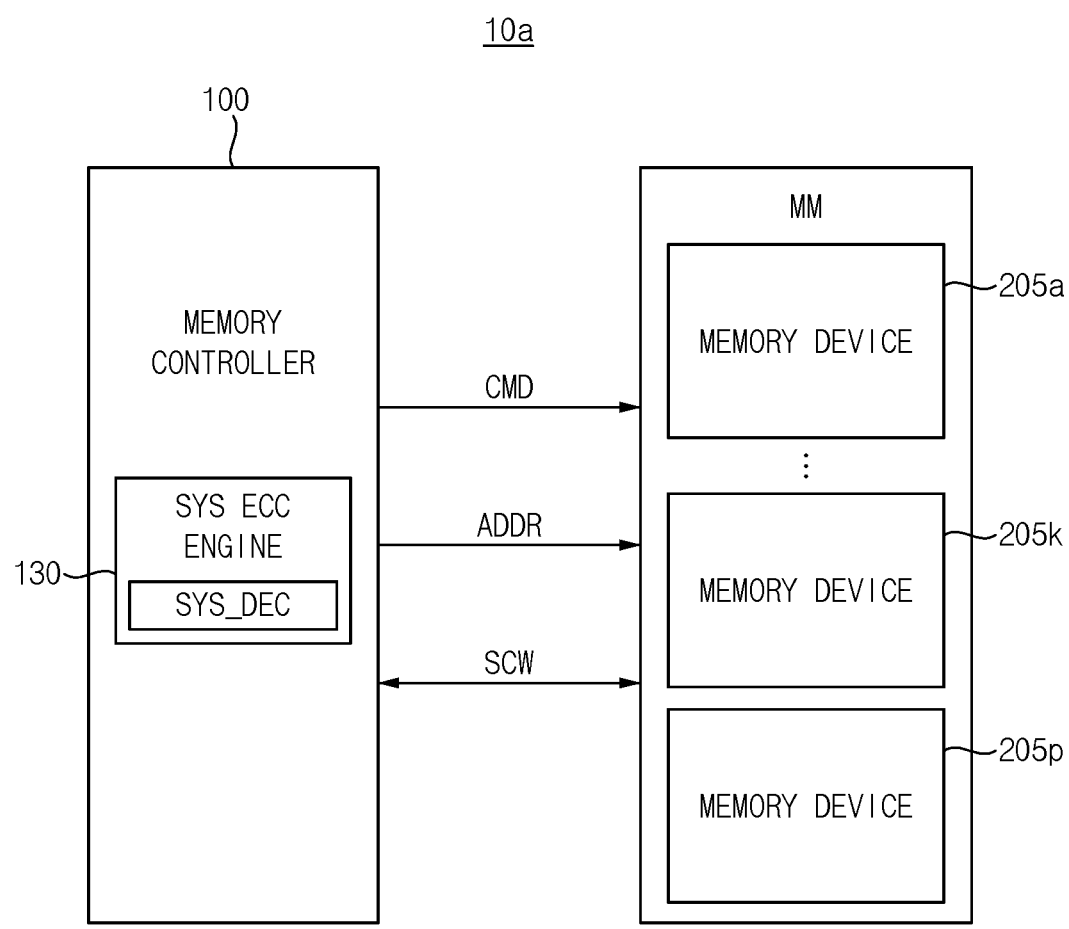
FIGS. 14 and 15 are block diagrams illustrating a memory device and a memory system according to example embodiments.
Figure 15:
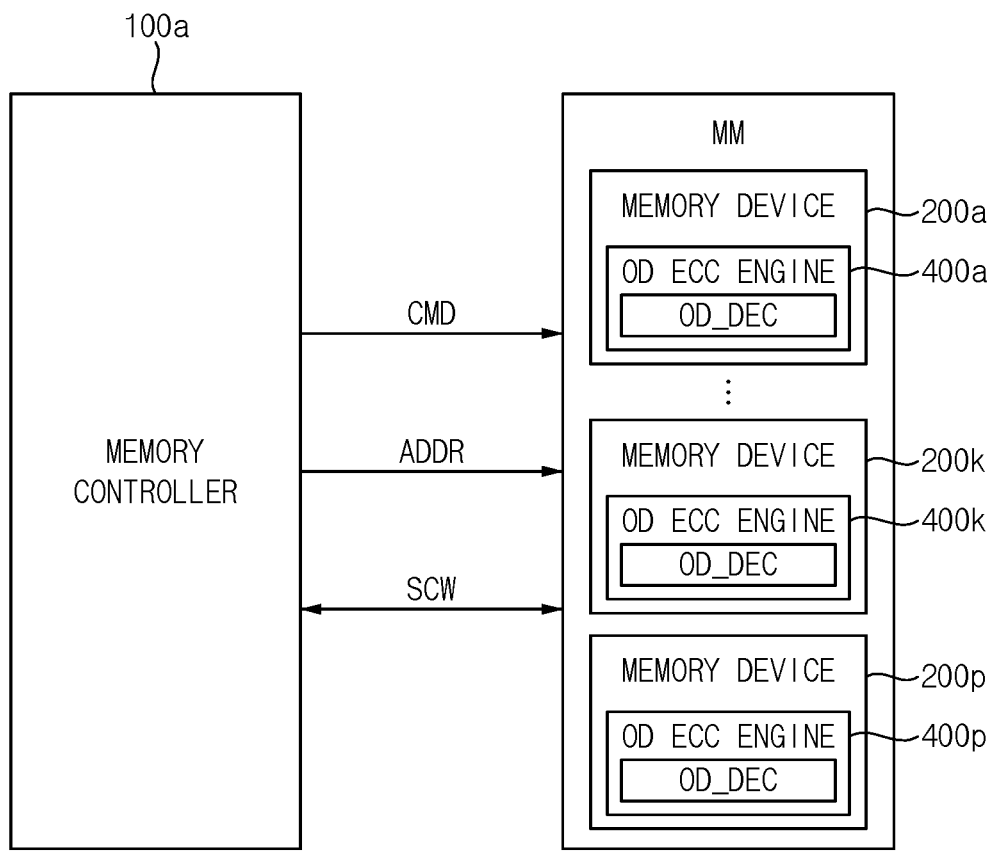

FIGS. 14 and 15 are block diagrams illustrating a memory device and a memory system according to example embodiments. The descriptions repeated with FIG. 7 will be omitted.

Referring to FIG. 14, a memory system 10a may include a memory controller 100 and a memory module MM. The memory module MM may include a plurality of memory devices (e.g., a plurality of memory chips) 205a ..., 205k, and 205p.

The memory system 10a may be substantially the same as the memory system 10 of FIG. 7, except that on-die ECC engines in the memory chips 205a to 205k and 205p are omitted. For example, the memory system 10a may perform only system ECC encoding/decoding by the system ECC engine 130 included in the memory controller 100.

Referring to FIG. 15, a memory system 10b may include a memory controller 100a and a memory module MM.

The memory system 10b may be substantially the same as the memory system 10 of FIG. 7, except that a system ECC engine in the memory controller 100a is omitted. For example, the memory system 10b may perform only on-die ECC encoding/decoding by the on-die ECC engines 400a to 400k and 400p respectively included in the memory chips 200a to 200k and 200p.

Figure 16:
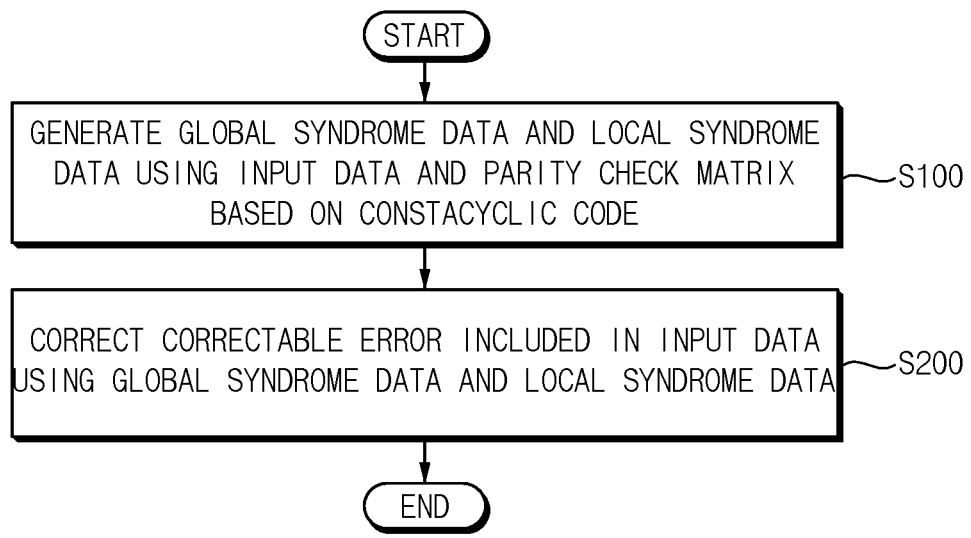
FIG. 16 is a flowchart illustrating a method of performing an ECC decoding according to example embodiments.

FIG. 16 is a flowchart illustrating a method of performing an ECC decoding according to example embodiments.

Referring to FIGS. 1 and 16, in a method of performing an ECC decoding according to example embodiments, the global syndrome data $S_G$ and the local syndrome data $S_L$ are generated using the input data $r^T$ and the parity check matrix H based on the constacyclic code (step S100). The correctable error included in the input data $r^T$ may be corrected using the global syndrome data $s_G$ and the local syndrome data $s_L$ (step S200). Thus, the single burst error SBST_ERR and the multi-bit error MB_ERR may be simultaneously detected and/or corrected. For example, step S100 may be performed by the syndrome generator 60 of FIG. 1 and step S200 may be performed by the burst error corrector 70 of FIG. 1.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 17:
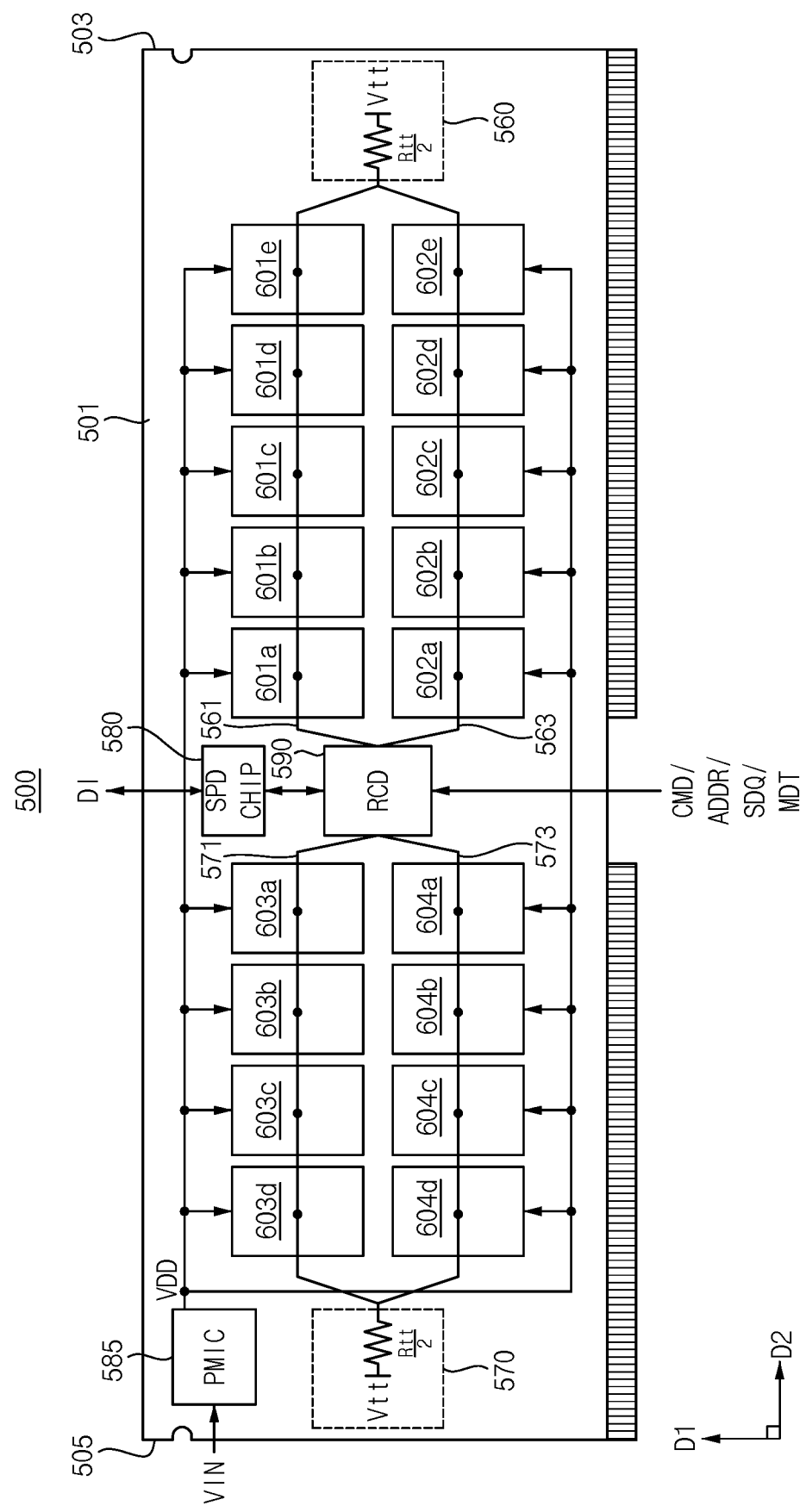
FIG. 17 is a block diagram illustrating an example of a memory module that may be employed to a memory system according to example embodiments.

FIG. 17 is a block diagram illustrating an example of a memory module that may be employed to a memory system according to example embodiments.

Referring to FIG. 17, a memory module 500 may include a buffer chip 590 (e.g., a registered clock driver; RCD) arranged in or mounted on a circuit board 501, a plurality of memory devices 601a, 601b, 601c, 601d, 601e, 602a, 602a, 602c, 602d, 602e, 603a, 603b, 603c, 603d, 604a, 604b, 604c and 604d, module resistance units 560 and 570, a serial present detection (SPD) chip 580, and/or a power management integrated circuit (PMIC) 585. The memory module 500 may correspond to one of the memory modules MMs in FIGS. 7, 9A, 9B, 14, and 15.

The buffer chip 590 may control the memory devices 601a to 601e, 602a to 602e, 603a to 603d and 604a to 604d, and the PMIC 585, under a control of the memory controller 100. For example, the buffer chip 590 may receive the address ADDR, the command CMD, the user data set SDQ and the meta data MDT from the memory controller 100.

The SPD chip 580 may be a programmable read only memory (PROM) (e.g., an electrically erasable PROM (EE-PROM)). The SPD chip 580 may include initial information and/or device information DI of the memory module 500. In some example embodiments, the SPD chip 580 may include the initial information and/or the device information DI such as a module form, a module configuration, a storage capacity, a module type, an execution environment, and/or the like of the memory module 500.

When a memory system including the memory module 500 is booted up, the memory controller 100 may read the device information DI from the SPD chip 580, and may recognize the memory module 500 based on the device information DI. The memory controller 100 may control the memory module 500 based on the device information DI from the SPD chip 580. For example, the memory controller 100 may recognize a type of the memory devices included in the memory module 500 based on the device information DI from the SPD chip 580.

Here, the circuit board 501, which may be a printed circuit board (PCB), may extend in a second direction D2, perpendicular to a first direction D1, between a first edge portion 503 and a second edge portion 505. The first edge portion 503 and the second edge portion 505 may extend in the first direction D1. The buffer chip 590 may be arranged on a center of the circuit board 501. The plurality of memory devices 601a to 601e, 602a to 602e, 603a to 603d and 604a to 604d may be arranged in a plurality of rows between the buffer chip 590 and the first edge portion 503, and between the buffer chip 590 and the second edge portion 505. In some example embodiments, operations described herein as being performed by the buffer chip 590 may be performed by processing circuitry.

In this example, the memory devices 601a to 601e and 602a to 602e may be arranged in or along a plurality of rows between the buffer chip 590 and the first edge portion 503. The memory devices 603a to 603d and 604a to 604d may be arranged in or along a plurality of rows between the buffer chip 590 and the second edge portion 505. The memory devices 601a to 601d, 602a to 602d, 603a to 603d and 604a to 604d may be referred to as data chips, and the memory devices 601e and 602e may be referred to as parity chips.

The buffer chip 590 may generate first parity data and second parity data based on the user data set SDQ and the meta data MDT, may store the user data set SDQ and the meta data MDT in the data chips, and may store the first parity data and the second parity data in the parity chips.

The buffer chip 590 may provide a command/address signal (e.g., CA) to the memory devices 601a to 601e through a command/address transmission line 561, and may provide a command/address signal to the memory devices 602a to 602e through a command/address transmission line 563. In addition, the buffer chip 590 may provide a command/address signal to the memory devices 603a to 603d through a command/address transmission line 571, and may provide a command/address signal to the memory devices 604a to 604d through a command/address transmission line 573.

The command/address transmission lines 561 and 563 may be connected in common to the module resistance unit 560 that is adjacent to the first edge portion 503, and the command/address transmission lines 571 and 573 may be connected in common to the module resistance unit 570 that is adjacent to the second edge portion 505. Each of the module resistance units 560 and 570 may include a termination resistor Rtt/2 connected to a termination voltage Vtt.

For example, each of or at least one of the plurality of memory devices 601a to 601e, 602a to 602e, 603a to 603d and 604a to 604d may be or include a DRAM device.

The SPD chip 580 may be arranged to be adjacent to the buffer chip 590, and the PMIC 585 may be between the memory device 603d and the second edge portion 505. The PMIC 585 may generate a power supply voltage VDD based on an input voltage VIN, and may provide the power supply voltage VDD to the memory devices 601a to 601e, 602a to 602e, 603a to 603d and 604a to 604d.

Figure 18:
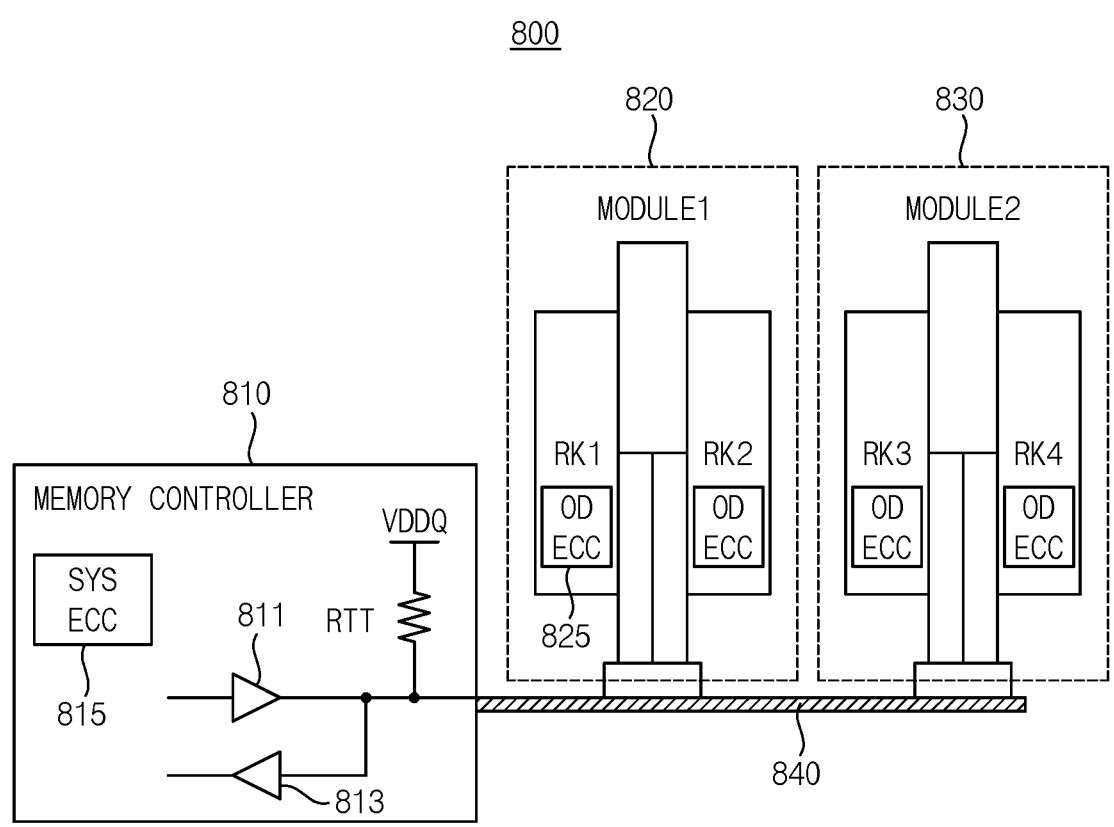
FIG. 18 is a block diagram illustrating an example of a memory system according to example embodiments.

FIG. 18 is a block diagram illustrating an example of a memory system according to example embodiments.

Referring to FIG. 18, a memory system 800 may include a memory controller 810 and/or memory modules 820 and 830. For example, the memory system 800 may have quad-rank memory modules. While two memory modules are depicted in FIG. 18, more or fewer memory modules may be included in the memory system 800, according to example embodiments.

The memory controller 810 may control the memory modules 820 and/or 830 so as to perform a command supplied from a processor and/or a host. The memory controller 810 may be implemented using processing circuitry (e.g., a processor) and/or may be implemented with a host, an application processor (AP) or a system-on-chip (SoC). For signal integrity, a source termination may be implemented with a resistor RTT on a bus 840 of the memory controller 810. The resistor RTT may be connected to a power supply voltage VDDQ. The memory controller 810 may include a transmitter 811 that may transmit a signal to at least one of the memory modules 820 and/or 830, and a receiver 813 that may receive a signal from at least one of the memory modules 820 and/or 830. The memory controller 810 may include a system ECC engine 815.

The memory modules 820 and 830 may be referred to as a first memory module 820 and a second memory module 830. The first memory module 820 and the second memory module 830 may be connected to the memory controller 810 through the bus 840. Each of the first memory module 820 and the second memory module 830 may correspond to one of the memory modules MMs in FIGS. 7, 9A, 9B, 14, and 15. The first memory module 820 may include memory ranks RK1 and RK2, and the second memory module 830 may include memory ranks RK3 and RK4.

Each of the first memory module 820 and the second memory module 830 may include a plurality of memory chips including a plurality of data chips and at least one parity chip, and each memory chip may include an on-die ECC engine 825.

The system ECC engine 815 may correspond to the system ECC engine 130 in FIG. 7, and the on-die ECC engine 825 may correspond to the on-die ECC engines 400a to 400k and 400p in FIG. 7. The system ECC engine 815 and the on-die ECC engine 825 may operate using the parity check matrix H based on the constacyclic code according to example embodiments, and thus the single burst error SBST_ERR and the multi-bit error MB_ERR may be simultaneously detected and/or corrected. In some example embodiments, the memory system 800 may be omitted one of the system ECC engine 815 and the on-die ECC engine 825.

Figure 19:
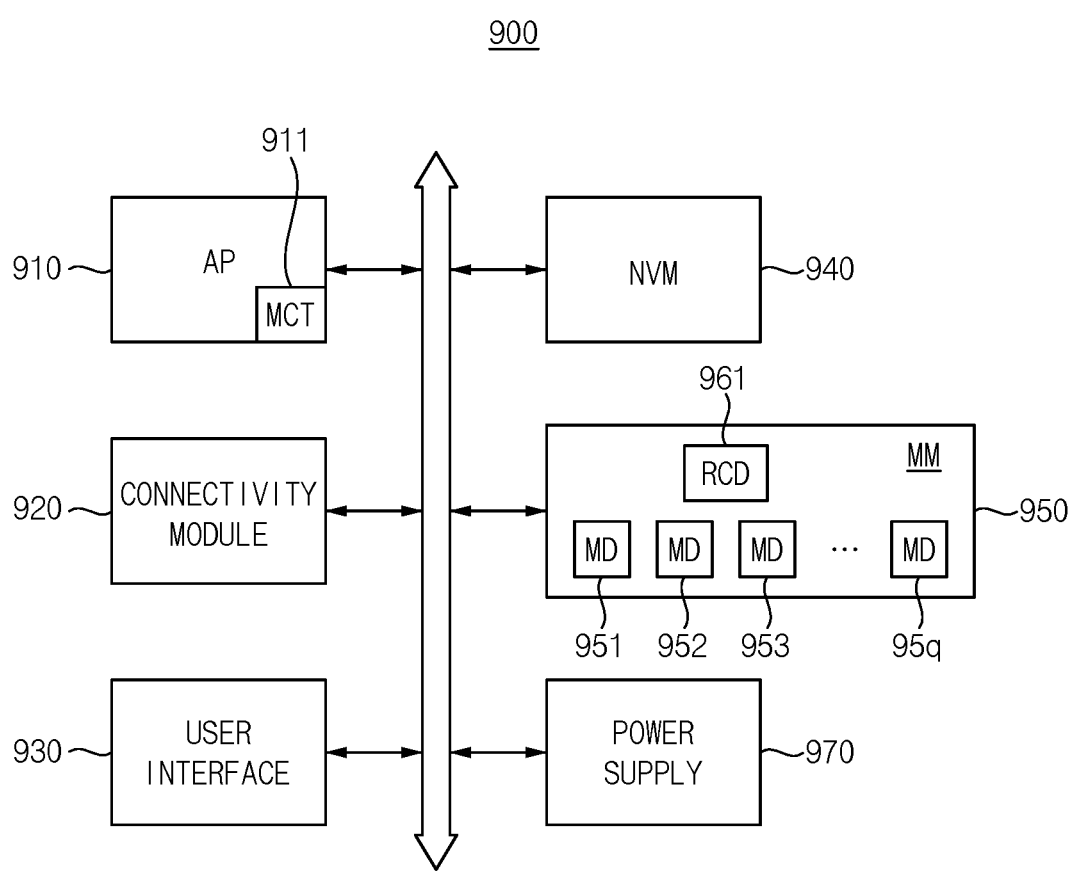
FIG. 19 is a block diagram illustrating an electronic system including a memory module according to example embodiments.

FIG. 19 is a block diagram illustrating an electronic system including a memory module according to example embodiments.

Referring to FIG. 19, an electronic system 900 may include an application processor 910, a connectivity module 920, a user interface 930, a nonvolatile memory device (NVM) 940, a memory module (MM) 950 such as a dual in-line memory module (DIMM), and/or a power supply 970. For example, the electronic system 900 may be a mobile system.

The application processor 910 may include a memory controller 911. The memory controller 911 may include a system ECC engine (e.g., the system ECC engine 130 in FIG. 7).

The application processor 910 may execute applications, such as at least one of a web browser, a game application, a video player, etc. The connectivity module 920 may perform wired and/or wireless communication with an external device.

The memory module 950 may store data processed by the application processor 910 and/or operate as a working memory. The memory module 950 may include a plurality of memory devices (MD) 951, 952, 953, . . . , and 95*q* (where q is a positive integer greater than three), and/or a buffer chip (RCD) 961. The memory module 950 may be the memory module 500 of FIG. 17.

The plurality of memory devices 951 to 95*q* may include a plurality of memory chips each of which includes an on-die ECC engine (e.g., one of the on-die ECC engines 400*a* to 400*k* and 400*p* in FIG. 7).

The nonvolatile memory device 940 may store a boot image for booting the electronic system 900. The user interface 930 may include at least one input device, such as a keypad, a touch screen, etc., and at least one output device, such as a speaker, a display device, etc. The power supply 970 may supply an operating voltage to the electronic system 900.

The electronic system 900 or components of the electronic system 900 may be mounted using various types of packages.

Although example embodiments are described with a focus on the memory device and the memory system, example embodiments may be used to correct and/or detect errors occurring in data transmission between a memory device and/or a memory system and other devices. For example, example embodiments may be applied or employed in connection with data transmission over various interfaces and/or interconnects, such as advanced technology attachment (ATA), serial ATA (SATA), parallel ATA (PATA), small computer small interface (SCSI), serial attached SCSI (SAS), peripheral component interconnection (PCI), PCI express (PCIe), compute express link (CXL), etc.

The inventive concept may be applied to various electronic devices and systems that include the memory devices and the memory systems. For example, the inventive concept may be applied to systems such as a personal computer (PC), a server computer, a cloud computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An error correction code (ECC) decoder comprising:
a syndrome generator configured to generate global syndrome data and local syndrome data using input data, which is provided from a memory device, and a parity check matrix based on a constacyclic code; and
a burst error corrector configured to correct a correctable error included in the input data using the global syndrome data and the local syndrome data,
wherein the input data includes a plurality of data bits arranged along a first direction and a second direction,
wherein the plurality of data bits include a plurality of symbols each symbol including two or more consecutive data bits along the first direction,
wherein errors of the input data include a single burst error and a multi-bit error,
wherein the single burst error occurs on two or more symbols arranged along the first direction, and the multi-bit error randomly occurs on two or more data bits of the plurality of data bits, and
wherein the ECC decoder is configured to simultaneously correct the single burst error and the multi-bit error.

2. The ECC decoder of claim 1, wherein the parity check matrix is obtained based on a parity check polynomial h(x) of Equation 1 as follows-:

$$h(x) = \frac{x^u + \lambda}{p'_i(\delta^{-1}x)} = \prod_{j \in I \setminus \{i\}} p'_j(\delta^{-1}x) \qquad \text{[Equation 1]}$$
$$= \prod_{i \in [0, u-l]} h_i x^i, \, h_i \in \mathbb{F}_{2^m}$$

wherein
j, l, m, and u are positive integers,
i is a positive integer greater than or equal to u,
$p_i(x)$ is a minimal polynomial, and
$\mathbb{F}_{2^m}$ is an extended binary finite field.

3. The ECC decoder of claim 2, wherein the parity check matrix h(x) includes a global parity check matrix $P_G$ and a local parity check matrix $P_L$.

4. The ECC decoder of claim 3, wherein the global parity check matrix $P_G$ is constructed based on Equation 2 and Equation 3 as follows:

$$P_G = [P'_U, \delta^v P'_U, \ldots, \delta^{v(u-1)} P'_U] \qquad \text{[Equation 2]}$$

-continued $$P'_U = \begin{bmatrix} h_0 & h_1 & \ldots & h_{u-l} & 0 & \ldots & 0 \\ 0 & h_0 & \ldots & h_{u-l-1} & h_{u-l} & \ldots & 0 \\ \ldots & \ldots & \ldots & \ldots & \ldots & \ldots & \ldots \\ 0 & 0 & \ldots & h_{u-2l+1} & h_{u-2l+2} & \ldots & h_{u-l} \end{bmatrix}$$ [Equation 3]

wherein:
l is an even integer, and
u and v are positive integers.

5. The ECC decoder of claim 4, wherein the local parity check matrix $P_L$ is constructed based on Equation 4 and Equation 5 as follows:

$$P_L = [P_{L,1}, \ldots, P_{L,u}]$$ [Equation 4]

$$P_{L,i} = \begin{bmatrix} \delta^{v(i-1)} & 0 & \ldots & 0 \\ 0 & \delta^{v(i-1)} & \ldots & 0 \\ \ldots & \ldots & \ldots & \ldots \\ 0 & 0 & \ldots & \delta^{v(i-1)} \end{bmatrix}$$ [Equation 5]

wherein i, u, and v are positive integers.

6. The ECC decoder of claim 5, wherein the global parity check matrix and the local parity check matrix are obtained by converting all elements in $P_G$ of Equation 2 and $P_L$ of Equation 4 into binary elements using a companion matrix defined by Equation 6 as follows:

$$T^i := [[\xi^i], [\xi^{i+1}], \ldots, [\xi^{i+2m-1}]] \in \mathbb{F}_2[T] \subset \mathbb{F}_2^{2m \times 2m}$$ [Equation 6]

wherein
i and m are positive integers, and
$\xi$ is a positive element of $\mathbb{F}_{2^{2m}}$.

7. The ECC decoder of claim 1,
wherein the parity check matrix includes a global parity check matrix and a local parity check matrix, and
wherein the syndrome generator includes:
a global syndrome calculator configured to generate the global syndrome data based on the input data and the global parity check matrix; and
a local syndrome calculator configured to generate the local syndrome data based on the input data and the local parity check matrix.

8. The ECC decoder of claim 1, wherein the burst error corrector includes:
an error generator configured to generate error data based on the local syndrome data;
an error checker configured to check whether an error has occurred based on the global syndrome data and the error data; and
a data corrector configured to generate error corrected data based on the input data and the error data in response to determining by the error checker that the error has occurred.

9. The ECC decoder of claim 8, wherein the parity check matrix includes a global parity check matrix and a local parity check matrix, and
wherein the error checker is configured to check whether the error has occurred by comparing the global syndrome data with data obtained by multiplying the global parity check matrix and the error data.

10. The ECC decoder of claim 1,
wherein the input data is provided from the memory device by a burst operation in which the plurality of data bits are output through a plurality of data input/output (I/O) pins based on a single command, and wherein the first direction corresponds to a burst length representing a unit of the burst operation.

11. A memory system comprising:
a memory module including a plurality of memory devices; and
a memory controller including a system error correction code (ECC) engine and configured to control the memory module,
wherein the system ECC engine includes a system ECC decoder configured to perform an ECC decoding,
wherein the system ECC decoder includes:
a first syndrome generator configured to generate first global syndrome data and first local syndrome data using a codeword set provided from the memory module and a first parity check matrix based on a constacyclic code; and
a first burst error corrector configured to correct a correctable error included in the codeword set using the first global syndrome data and the first local syndrome data,
wherein the codeword set includes a plurality of data bits arranged along a first direction and a second direction,
wherein the plurality of data bits include a plurality of symbols each symbol including two or more consecutive data bits along the first direction,
wherein errors of the codeword set includes a single burst error and a multi-bit error,
wherein the single burst error occurs on two or more symbols arranged along the first direction, and the multi-bit error randomly occurs on two or more data bits of the plurality of data bits, and
wherein the system ECC decoder is configured to simultaneously correct the single burst error and detect the multi-bit error.

12. The memory system of claim 11,
wherein the codeword set is provided from the memory module by a burst operation in which the plurality of data bits are output through a plurality of data input/output (I/O) pins based on a single read command provided from the memory controller to the memory module, and
wherein the first direction corresponds to a burst length representing a unit of the burst operation.

13. The memory system of claim 11, wherein the system ECC engine further includes a memory configured to store the first parity check matrix.

14. The memory system of claim 11, wherein the system ECC engine further includes a system ECC encoder configured to perform an ECC encoding.

15. The memory system of claim 11,
wherein each of the plurality of memory devices includes a memory cell array and an on-die ECC engine,
wherein the on-die ECC engine includes an on-die ECC decoder configured to perform an ECC decoding, and
wherein the on-die ECC decoder includes:
a second syndrome generator configured to generate second global syndrome data and second local syndrome data using read data provided from the memory cell array and a second parity check matrix based on a constacyclic code; and
a second burst error corrector configured to correct a correctable error included in the read data using the second global syndrome data and the second local syndrome data.

16. The memory system of claim 15, wherein the on-die ECC decoder further includes a memory configured to store the second parity check matrix.

17. The memory system of claim 15, wherein the on-die ECC decoder further includes an on-die ECC encoder configured to perform an ECC encoding.

18. The memory system of claim 11, wherein the plurality of memory devices include a plurality of data chips and at least one parity chip.

19. The memory system of claim 11, wherein each of the plurality of memory devices includes a dynamic random access memory (DRAM).

20. A memory device comprising:
  a memory cell array; and
  an error correction code (ECC) decoder configured to perform an ECC decoding on read data provided from the memory cell array,
  wherein the ECC decoder includes:
    a syndrome generator configured to generate global syndrome data and local syndrome data using the read data provided from the memory cell array and a parity check matrix based on a constacyclic code; and
    a burst error corrector configured to correct a correctable error included in the read data using the global syndrome data and the local syndrome data, wherein the read data includes a plurality of data bits arranged along a first direction and a second direction,
  wherein the plurality of data bits include a plurality of symbols each symbol including two or more consecutive data bits along the first direction,
  wherein errors of the read data include a single burst error and a multi-bit error,
  wherein the single burst error occurs on two or more symbols arranged along the first direction, and the multi-bit error randomly occurs on two or more data bits of the plurality of data bits, and
  wherein the ECC decoder is configured to simultaneously detect the single burst error and the multi-bit error.

* * * * *